United States Patent
Brunco et al.

(10) Patent No.: US 7,517,765 B2
(45) Date of Patent: Apr. 14, 2009

(54) METHOD FOR FORMING GERMANIDES AND DEVICES OBTAINED THEREOF

(75) Inventors: David P. Brunco, Tervuren (BE); Karl Opsomer, Gavere (BE); Brice De Jaeger, Leuven (BE)

(73) Assignees: Interuniversitair Microelektronica Centrum (IMEC), Leuven (BE); Intel Corporation (INTEL), Santa Clara, CA (US); Katholieke Universiteit Leuven (KUL), Leuven (BE)

( * ) Notice: Subject to any disclaimer, the term of this patent is extended or adjusted under 35 U.S.C. 154(b) by 0 days.

(21) Appl. No.: 11/517,654

(22) Filed: Sep. 8, 2006

(65) Prior Publication Data
US 2007/0032025 A1 Feb. 8, 2007

Related U.S. Application Data

(63) Continuation-in-part of application No. 11/079,022, filed on Mar. 8, 2005, now abandoned.

(60) Provisional application No. 60/551,543, filed on Mar. 8, 2004.

(51) Int. Cl.
*H01L 21/336* (2006.01)
(52) U.S. Cl. .................. 438/300; 438/142; 438/149; 438/152; 257/E21.162; 257/E21.001; 257/E21.09
(58) Field of Classification Search ............ 438/300, 438/142, 149; 257/E21.001, E21.09
See application file for complete search history.

(56) References Cited

U.S. PATENT DOCUMENTS

| 5,780,362 A | 7/1998 | Wang et al. ............... 438/683 |
| 6,703,291 B1 | 3/2004 | Boyanov et al. ........... 438/507 |
| 2002/0134982 A1* | 9/2002 | Maa et al. ................... 257/67 |
| 2003/0006461 A1 | 1/2003 | Tezuka et al. .............. 257/347 |
| 2003/0164524 A1* | 9/2003 | Stephan et al. ............. 257/369 |
| 2005/0196962 A1 | 9/2005 | Demeurisse et al. |
| 2005/0250301 A1 | 11/2005 | Cabral et al. |

OTHER PUBLICATIONS

K.Y. Lee et al., "Formation and Morphology Evolution of Nickel Germanides on Ge (100) under Rapid Thermal Annealing," Mat. Res. Soc. Symp. Proc. vol. 810 (2004), pp. 55-59.
Shiyang Zhu, "Temperature Dependence of Ni-Germanide Formed by Ni-Ge Solid-State Reaction," Ext. Abs. the 5th Int'l Workshop on Junction Tech. 2005, pp. 85-88.

(Continued)

*Primary Examiner*—Walter L Lindsay, Jr.
*Assistant Examiner*—Abdulfattah Mustapha
(74) *Attorney, Agent, or Firm*—McDonnell Boehnen Hulbert & Berghoff LLP

(57) ABSTRACT

The present invention discloses a method for forming germanides on substrates with exposed germanium and exposed dielectric(s) topography, thereby allowing for variations in the germanide forming process. The method comprises the steps of depositing nickel on a substrate having topography, performing a first thermal step to convert substantially all deposited nickel in regions away from the topography into a germanide, selectively removing the unreacted nickel, and performing a second thermal step to lower the resistance of formed germanide.

19 Claims, 28 Drawing Sheets

OTHER PUBLICATIONS

Yu et al., "Al$_2$O$_3$-Ge-On-Insulator n and p-MOSFETs With Fully NiSi and NiGe Dual Gates," IEEE Electron Device Letters, vol. 25, No. 3, Mar. 2004.

S. Gaudet et al., "Thin Film Reaction of Transition Metals with Germanium," Journal of Vacuum Scinece Technology, A24(3) May/Jun. 2006.

E. Simoen et al., "Deep Level Transient Spectroscopy Study of Nickel-Germanide Schottky Barriers on N-Type Germanium," Applied Physics Letter 88, 183506 (2006).

Yu et al., "Fully Silicided NiSi and Germanided NiGe Dual Gates on SiO$_2$ n- and p-MOSFETs," IEEE Electron Device Letters, vol. 24, No. 11, Nov. 2003.

* cited by examiner

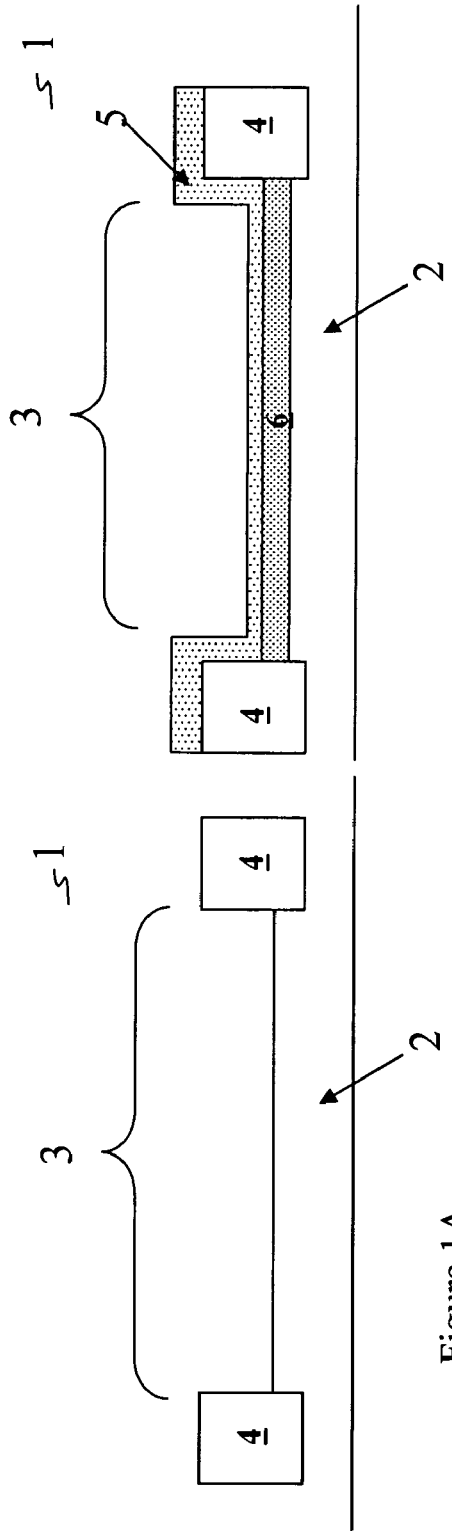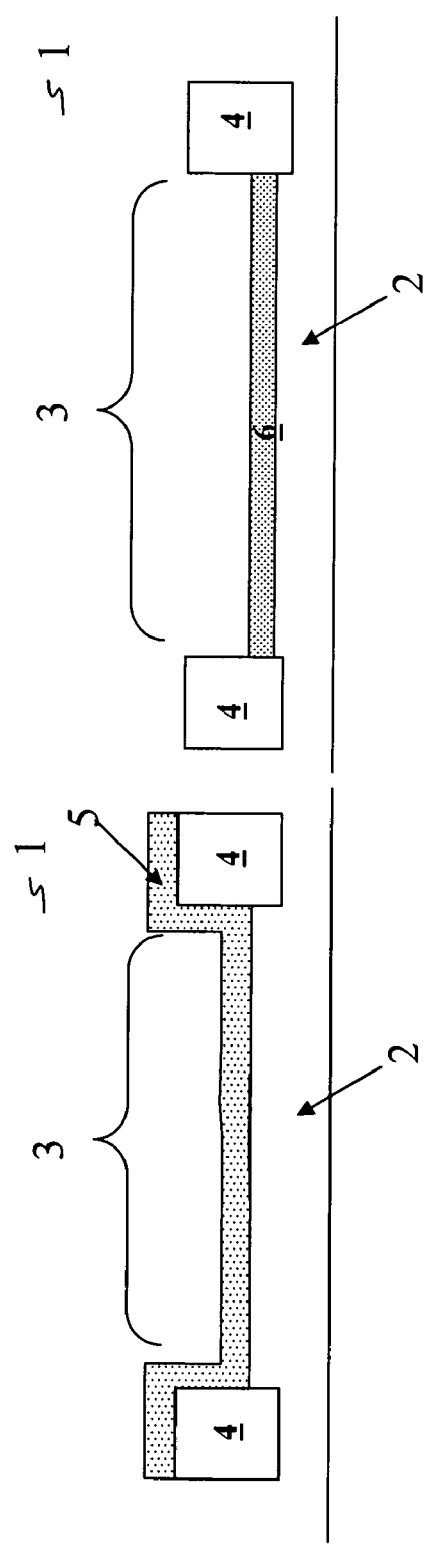

METHOD FOR FORMING GERMANIDES AND DEVICES OBTAINED THEREOF

RELATED APPLICATIONS

This application is a continuation-in-part of U.S. patent application Ser. No. 11/079,022, filed on Mar. 8, 2005. This application also claims priority to U.S. Provisional Application No. 60/551,543 filed on Mar. 8, 2004. The entire disclosures of U.S. patent application Ser. No. 11/079,022 and U.S. Provisional Application No. 60/551,543 are herein incorporated by reference.

THE NAMES OR PARTIES TO A JOINT RESEARCH AGREEMENT

IMEC and Intel are parties to a joint research agreement dated Sep. 8, 2003. The joint research agreement pertains to the field of semiconductor processing.

FIELD

This invention is related to the field of semiconductor processing and, more particularly to the formation of low resistance layers on germanium substrates.

BACKGROUND

An approach for modifying the electronic properties of a semiconductor element (e.g. to reduce the resistivity of a semiconductor region in a substrate, so as to change the work-function of a semiconductor gate electrode formed upon this substrate) is to deposit a metal over at least the particular semiconductor element. The stack that includes the metal and the semiconductor material is then heated to produce a semiconductor-metal compound layer. This layer has a lower resistivity than the resistivity of the starting semiconductor material and, thus, has a different work-function. Unreacted metal is then removed from the substrate, such as selectively from the semiconductor-metal compound. Such a process leaves the semiconductor-metal compound layer intact and removes excess unreacted metal from the deposition and heating operations. The semiconductor layers formed by such processes may be referred to as semiconductor metalide layers.

A semiconductor metalide layer that is obtained by selectively removing unreacted metal without performing any subsequent masking step to pattern the metalide layer is typically referred to as a self-aligned structure. In certain embodiments, an additional heating step is performed to further reduce the resistivity of the semiconductor metalide layer, e.g. by changing the crystal phase of this layer.

Examples of such semiconductor-metal compounds are silicides. Metal silicide thin films are commonly used in microelectronic circuits in a variety of applications, such as interconnects, contacts and for the formation of transistor gates. For example, Titanium disilicide ($TiSi_2$), Cobalt disilicide ($CoSi_2$), and/or Nickel silicide (NiSi) are used in Ultra Large Scale Integration Semiconductor devices having submicron feature sizes. As is known, silicide layers have a lower sheet resistance than the corresponding sheet resistance of the silicon from which they are formed.

Due to its electronic properties, germanium is, for various MOS technologies, considered to be a replacement for silicon as the semiconductor material of choice to form substrates and/or gate electrodes. Germanides, e.g. compounds resulting from the reaction between germanium and a metal, such as Ni, are used to reduce the resistivity of source and drain regions, or to reduce the resistivity of gate electrodes and, thus, modify the work-function of the gate electrodes. However, current approaches do not provide for selective removal of unreacted metal to produce self-aligned germanides.

SUMMARY

Methods for removing unreacted metal from germanium layers, germanide layers, and/or dielectric layers, such as to form self-aligned germanides, are disclosed. Further, compositions for removing such unreacted metal are described.

A composition for removing unreacted metal, e.g. Ni, from a germanium layer, a germanide layer and/or a dielectric layer includes one or more hydrohalides, e.g. HCl. The composition may also further comprise $H_2SO_4$, which allows for the removal of unreacted metals without heating. The composition is used to remove unreacted metal(s) that are used to form a self-aligned metal-germanide compound. Such metals include Ti, Co, Pt, Pd and Ru, among others.

A method for forming a self-aligned germanide comprises selectively removing unreacted metal(s) from a germanium layer, a germanide layer and/or a dielectric layer, by contacting said unreacted metal(s) with a chemical composition, heated or not, that includes one or more hydrohalides. As noted above, the composition may further include $H_2SO_4$. Using such compositions and methods, a semiconductor device including a self-aligned germanide layer (from which unreacted metal has been removed) may be formed.

A method for forming a nickel-germanide on a substrate comprises providing a substrate comprising an exposed germanium area bordering a dielectric area; depositing nickel over the substrate; performing a first thermal process step for which a first thermal budget is selected to convert, in center regions of the germanium area, substantially all metal into a nickel-germanide; selectively removing unreacted metal; and performing a second thermal process step for which a second thermal budget is selected to lower a resistance of the formed germanide layer. The dielectric area may be a field isolation region or a spacer. The germanide layer formed during the first thermal process step may be predominantly a metal-rich germanide. In one example, the germanide-forming metal comprises or is nickel.

In one example, the temperature of the first thermal step may be in the range of 150° C. to 325° C., for a time period in the range of nearly 0 seconds to 300 seconds. In another example, the first thermal step may be in the range of 200° C. to 270° C., for a time period in the range of 10 seconds to 60 seconds. In one example, the temperature of the second thermal step is in the range of 300° C. to 550° C., for a time period in the range of nearly 0 seconds to 300 seconds. In another example, the temperature of the second thermal step is in the range of 325° C. to 400° C., for a time period in the range of 10 seconds to 60 seconds.

A method for forming a germanide on a substrate comprises providing a substrate comprising an exposed germanium area bordered by a dielectric area; depositing nickel over the substrate; performing a first thermal process step for which a first thermal budget is selected to convert, in regions of the germanium area away from the dielectric area, substantially all nickel into a nickel-germanide and to limit diffusion of germanium over the dielectric area; selectively removing unreacted nickel; and performing a second thermal process step for which a second thermal budget is selected to lower a resistance of the formed nickel-germanide layer. The nickel-germanide formed during the first thermal process step may comprise metal-rich germanide phases and the nickel-germanide formed during the second thermal process step consists essentially of a mono-nickel mono-germanium ($Ni_1Ge_1$) phase.

A substrate is also described comprising a nickel-germanide formed on a germanium area bordering a dielectric region, wherein essentially no pits are present in the germanium area near the germanium-dielectric region and essentially no germanide is present on the dielectric region.

BRIEF DESCRIPTION OF THE DRAWINGS

Various embodiments are described herein with reference to the following drawings. Certain aspects of the drawings are depicted in a simplified way for reason of clarity. Not all alternatives and options are shown in the drawings and, therefore, the invention is not limited in scope to the content of the drawings. Like numerals are employed to reference like parts in the different figures, in which:

FIGS. 1A-1D are cross-sectional drawings that illustrate a semiconductor device structure before, during and after formation of self-aligned germanide;

DETAILED DESCRIPTION

Figure 2C:
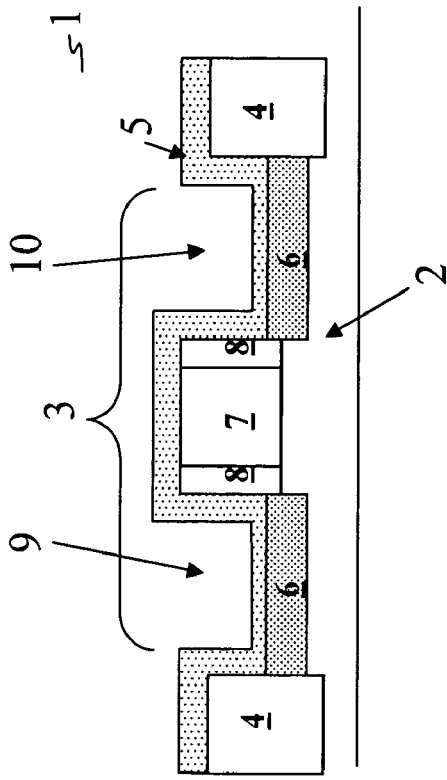
FIGS. 2A-2E are cross-sectional drawings that illustrate another semiconductor device structure before, during and after formation of self-aligned germanide.

The following description discusses various embodiments related to the formation of self-aligned germanides, including chemical compositions and methods for the formation of self-aligned germanides, such as on a germanium layer, or on a semiconductor substrate. Generally, such self-aligned germanides may be formed by depositing a layer of metal over a substrate and a germanium region, heating the structure to form a compound of the metal and the germanium and selectively removing unreacted metal, e.g. using a selective etching technique. One such selective etching technique is performed using a chemical composition that includes one or more hydrohalides. Various embodiments of chemical compositions that may be used to remove unreacted metals will be described below. Further, various methods for forming self-aligned germanides using such chemical compositions will also be described. It will be appreciated that there are numerous variations and modifications of these embodiments that are possible. Accordingly, the description of the various embodiments should not be deemed to limit the scope of the invention, which is defined by the claims.

Compositions of Chemical Solutions for Forming Self-Aligned Germanides

Compositions that substantially and selectively remove unreacted metal or metals from germanium layers, germanide layers and/or dielectric layers without substantially adversely affecting those layers are disclosed. The term "selective removal of unreacted metal" or "selective etching of unreacted metal", and the like, refer to the substantial removal of such unreacted metal from a support (e.g., underlying) layer (e.g. a germanide layer) without substantially affecting (etching) the support layer. The term "substantial" or "substantially", in reference to the removal (etching) of unreacted metal(s), means that more than 95% of the metal layer is removed, more than 98% of the metal layer is removed, or 99% or more of the metal is removed.

An embodiment of a chemical composition that may be used for this purpose comprises one or more hydrohalide(s). The one or more hydrohalides may be selected from the group consisting of HF, HCl, HBr and HI. The chemical composition may also further comprise $H_2SO_4$. In certain situations, a solution of $NH_4OH$ and/or a solution of $H_3PO_4$ may also be added to the chemical composition. The chemicals used to prepare such chemical compositions are dilutions that are present in commercially available hydrohalide solutions. Such solutions are commonly used in other areas of VLSI (Very Large Scale Integration) processing. For example, an HCl starting solution may be a 37 wt. % concentrated solution, an $H_2SO_4$ starting solution may be a 95-97 wt. % concentrated solution, an HF starting solution may be a 49 wt. % concentrated solution and an HBr starting solution can be a 48 wt. % concentrated solution.

The concentration of the different chemical elements in the compositions described herein can be expressed as an x:y ratio or an x:y:z ratio where x, y and z are real numbers and refer to volumetric portions for each component. For example, an $HCl:H_2O$ (1:3) composition means a composition consisting of 1 volumetric part of an HCl solution (such as the HCl solution described above) with 3 volumetric parts of $H_2O$ mixed together. The concentration of the different components in the compositions described herein may also be expressed in terms of wt. %.

Figure 8A:
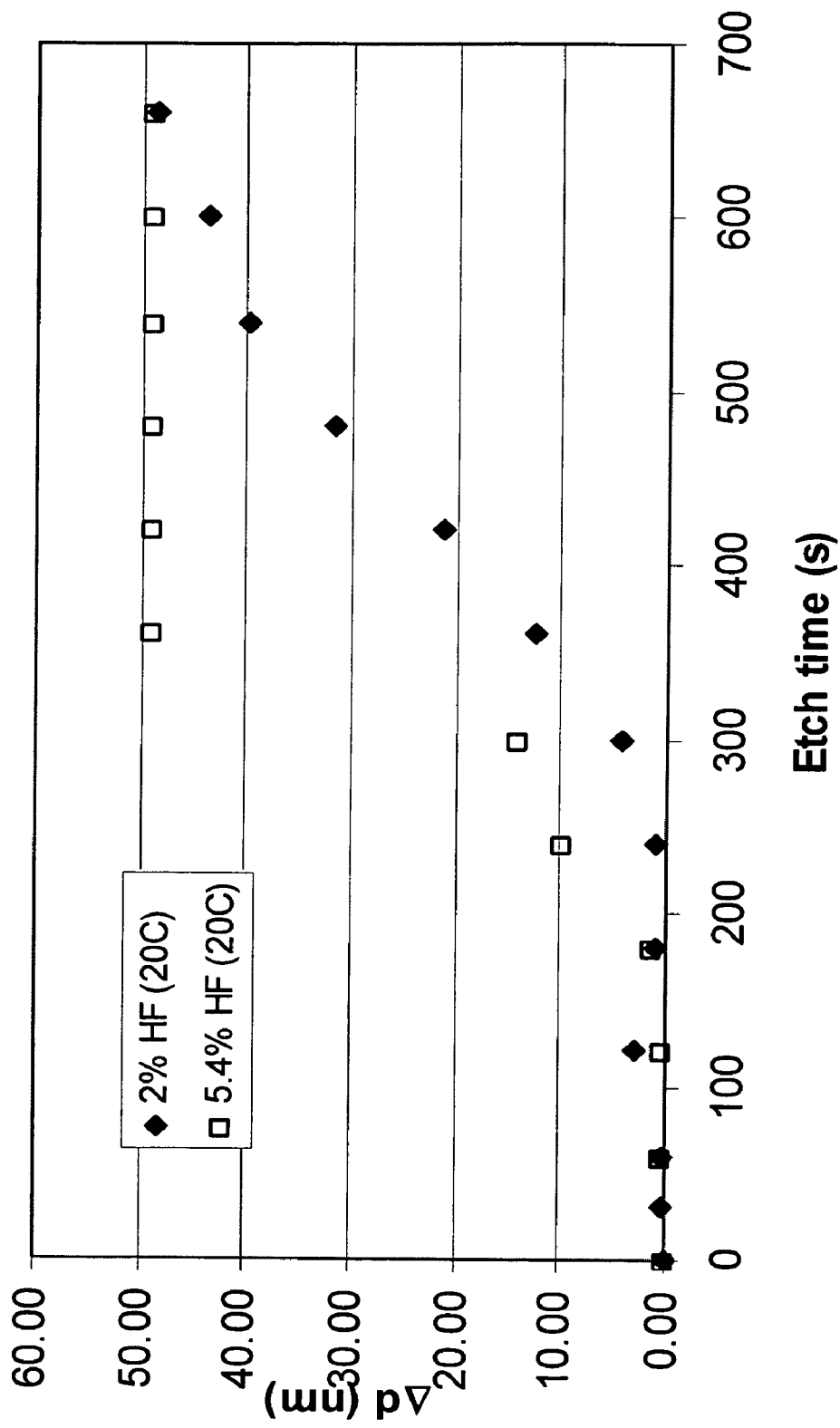
FIGS. 8A and 8B are graphs that illustrate the etch rate of Ni (FIG. 8A) and Ni-germanide (FIG. 8B) using $HF:H_2O$ compositions of different HF concentrations.
Figure 8B:
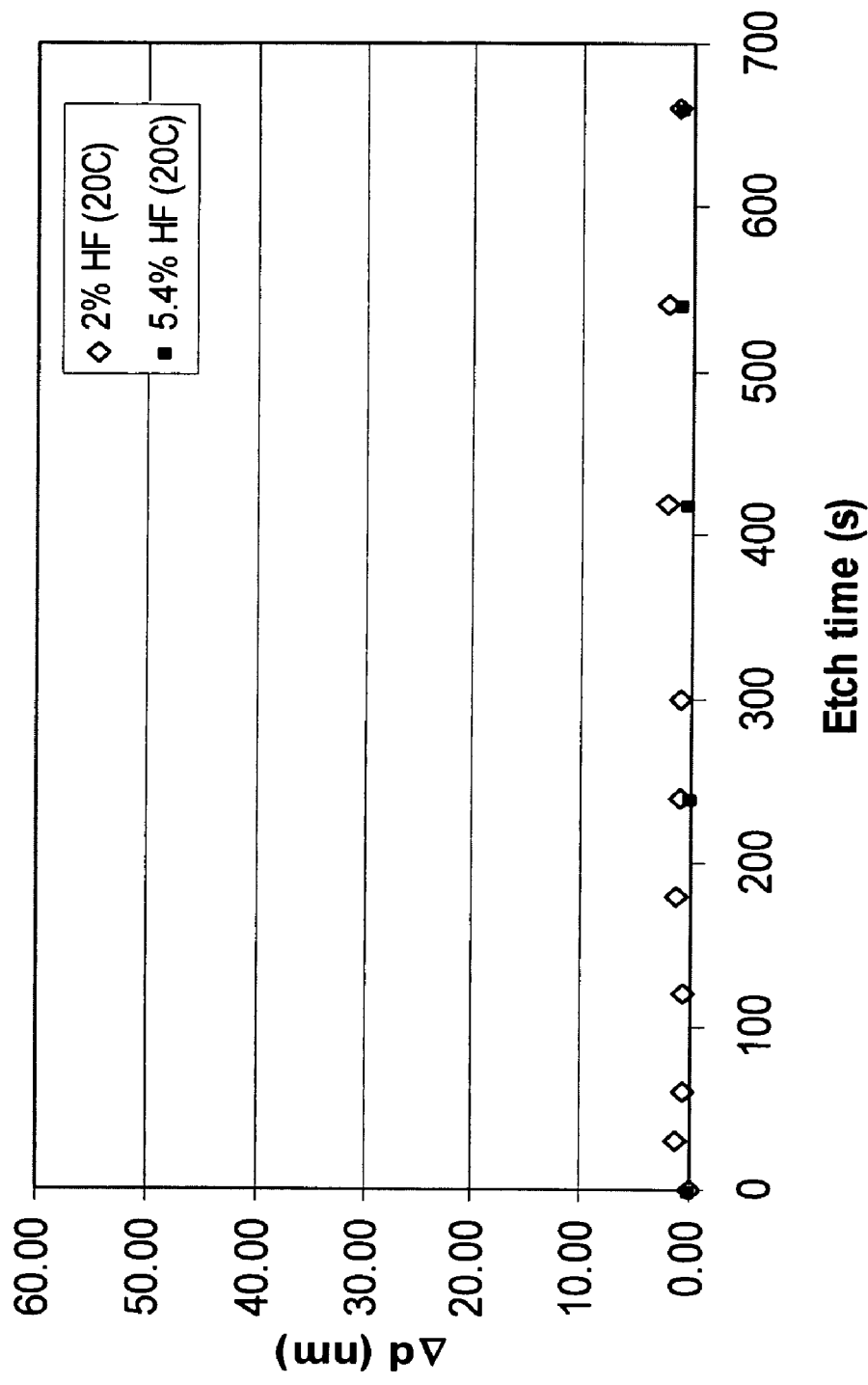

In one embodiment, a composition for selectively removing one or more metals from a germanium layer, a germanide layer and/or a dielectric layer may include less than about 25 wt. % of HF based on the total weight of the composition, less than about 12 wt. %, or less than about 6 wt. %. Referring to FIGS. 8A and 8B, graphs are shown that illustrate the etch rate of Ni (FIG. 8A) and Ni-germanide (FIG. 8B) using HF:$H_2O$ etch compositions with different HF concentrations. Substantially all of the unreacted Ni is removed within 360 seconds with an HF:$H_2O$ composition having a 1:9 ratio. It will be appreciated that HF would normally not be used when the dielectric material is $SiO_2$, as HF is reactive with (etches) $SiO_2$.

Figure 7A:
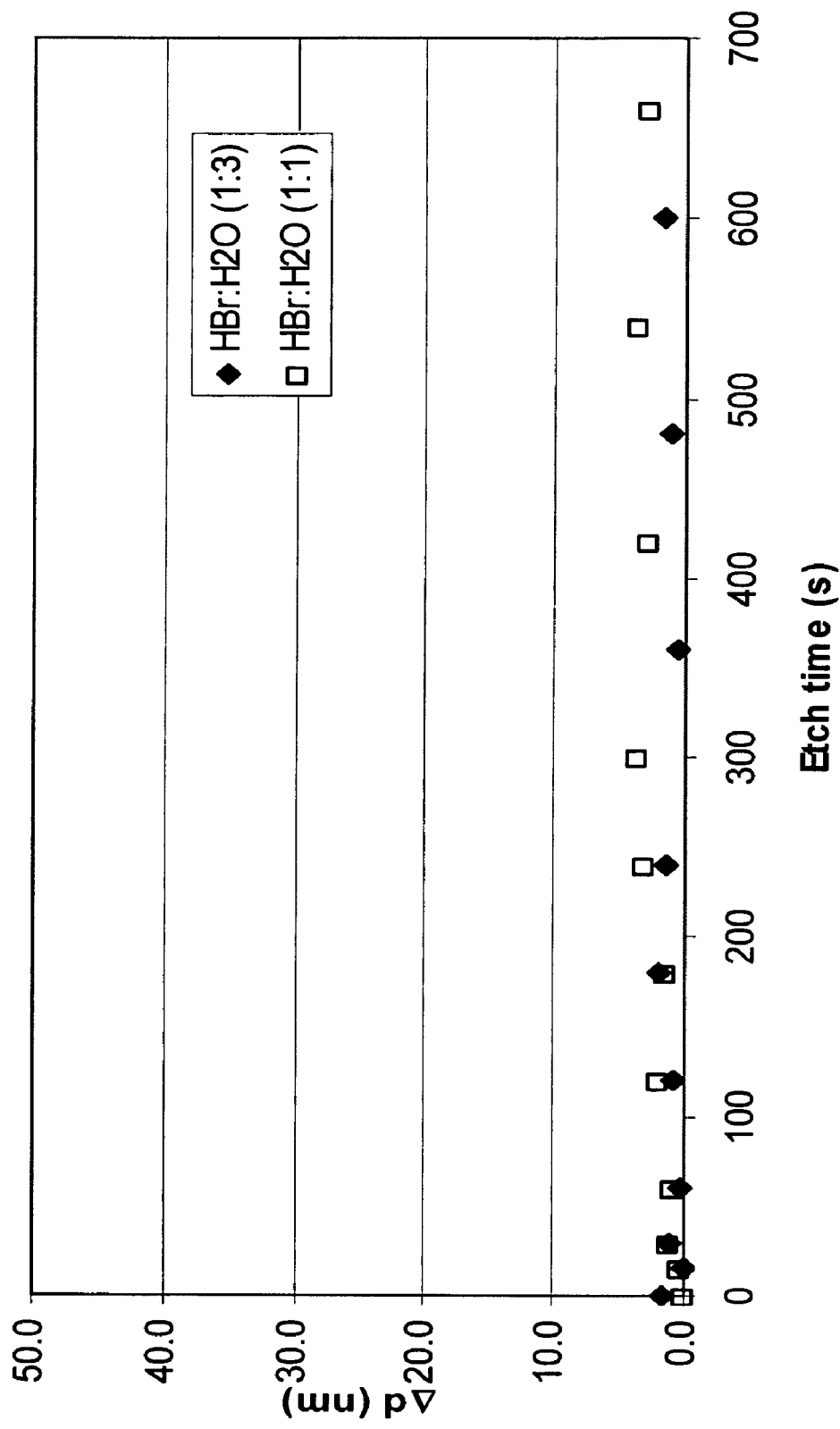
FIGS. 7A and 7B are graphs that illustrate the etch rate of Ni (FIG. 7A) and Ni-germanide (FIG. 7B) using $HBr:H_2O$ etch compositions of different HBr concentrations.
Figure 7B:
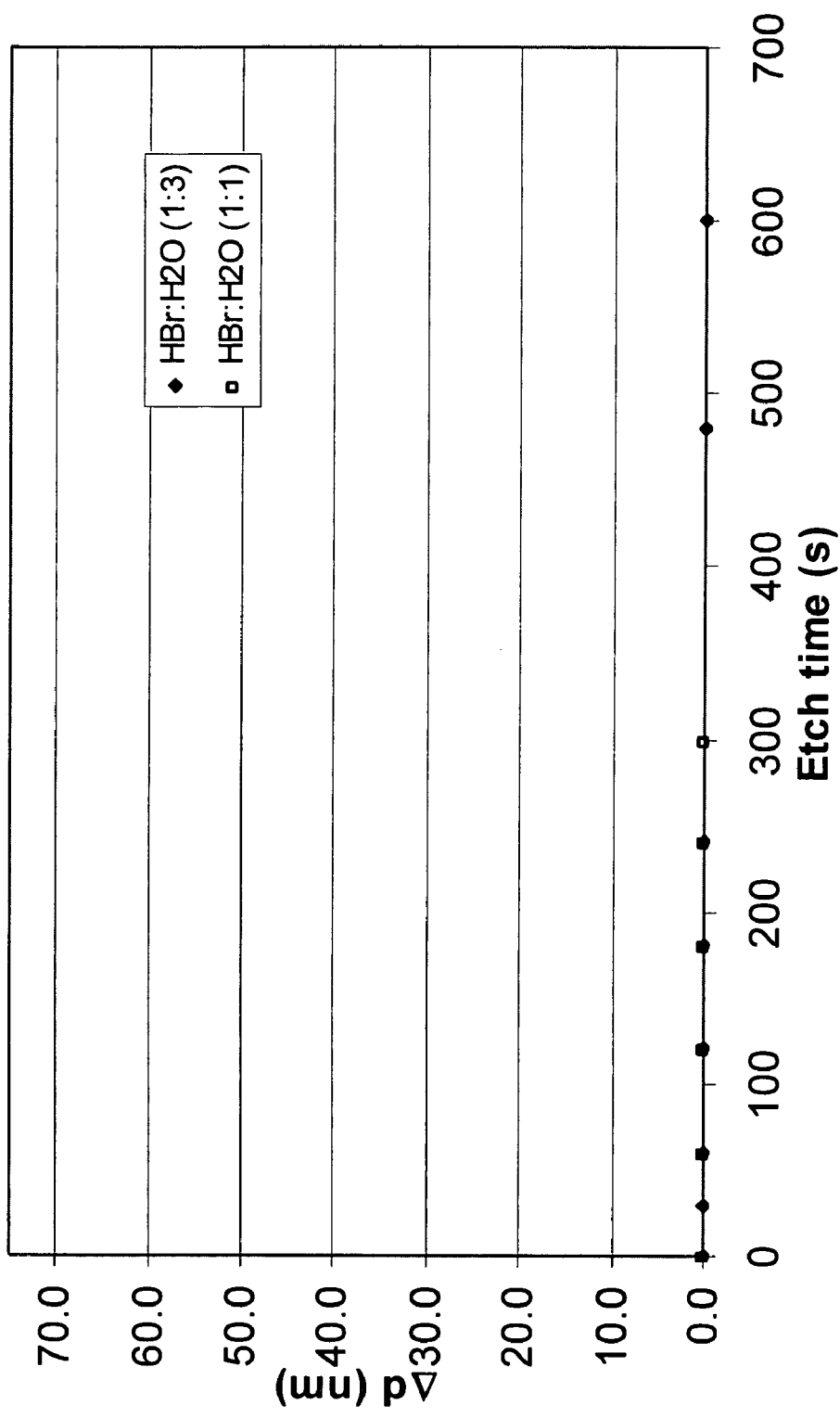

In another embodiment, an alternative composition for selectively removing one or more metals from a germanium layer, a germanide layer and/or a dielectric layer includes less than about 48 wt. % of HBr based on the total weight of the composition, less than about 32 wt. %, or less than about 24 wt. %. Referring to FIGS. 7A and 7B, graphs are shown that illustrate the etch rate of Ni (FIG. 7A) and Ni-germanide (FIG. 7B) using HBr:$H_2O$ etch compositions with different HBr concentrations. As shown, the etch rate of Nickel is relatively slow. However, those skilled in this area would understand that higher concentrations of HBr and higher temperatures would increase the etch rates from those shown in FIGS. 7A and 7B.

Figure 4A:
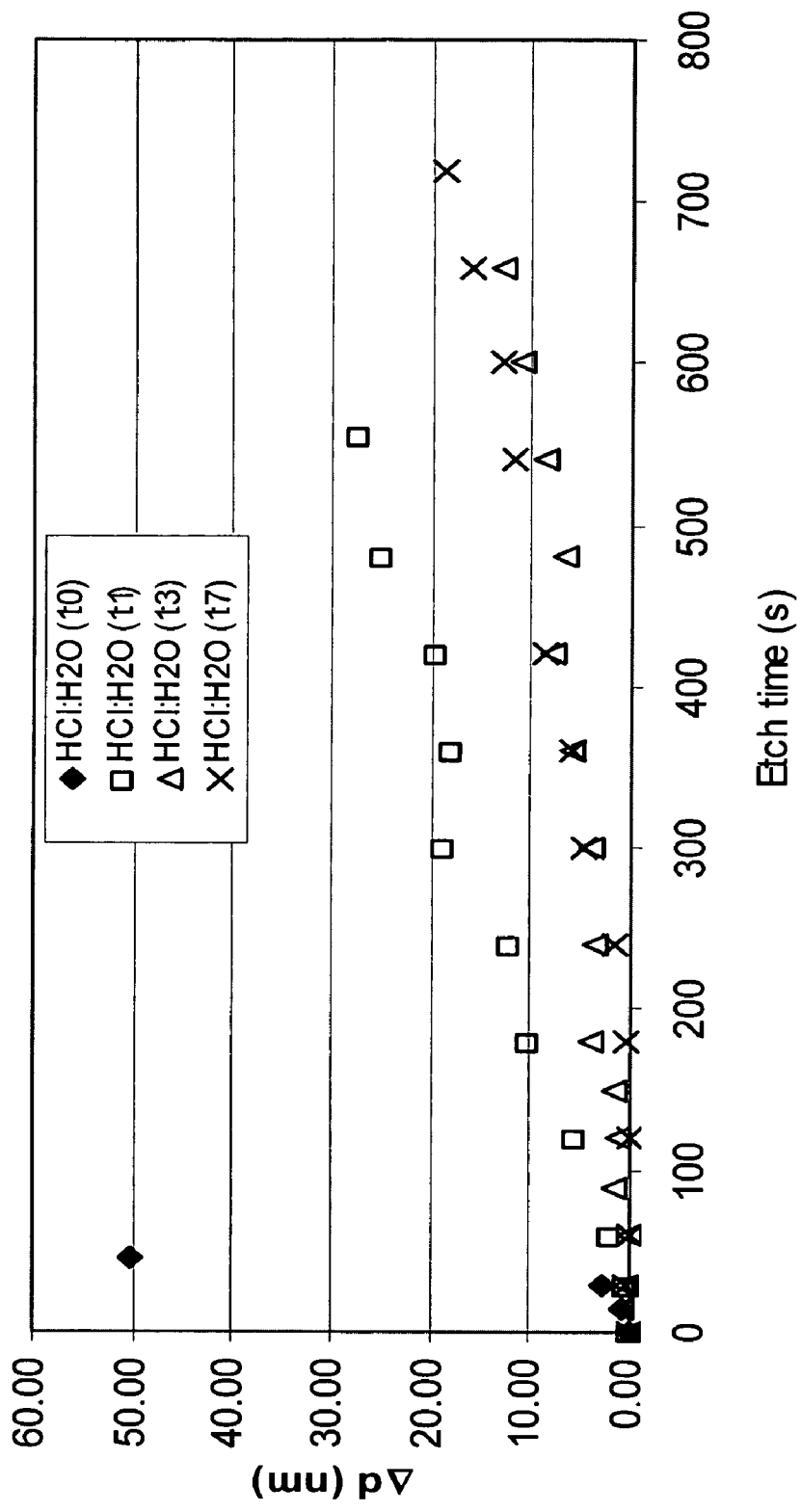
FIGS. 4A and 4B are graphs that illustrates etch rates of Ni (FIG. 4A) and Ni-germanide (FIG. 4B) using $HCl:H_2O$ etch compositions of different concentrations.
Figure 4B:
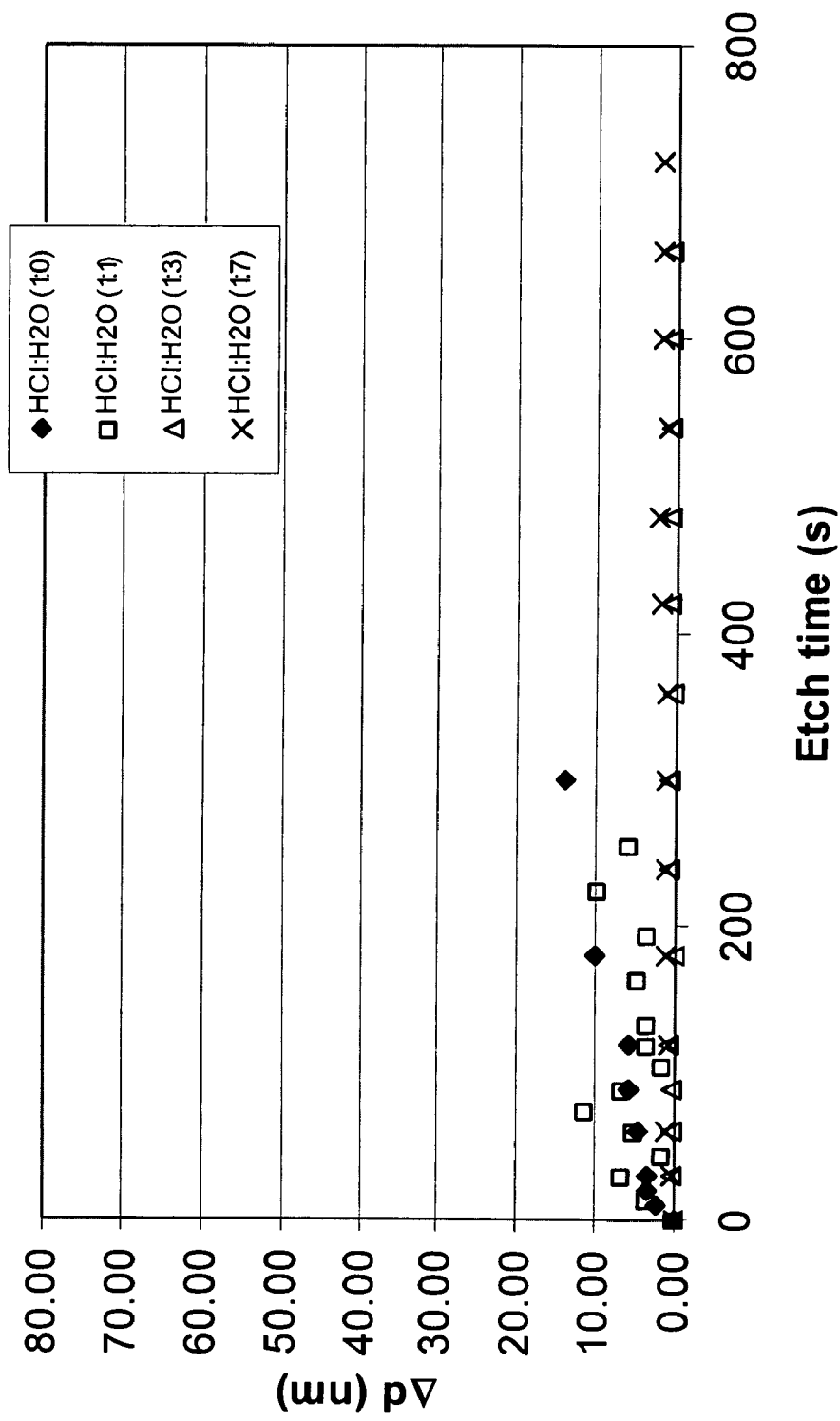

In still another embodiment, a composition for selectively removing one or more metals from a germanium layer, a germanide layer and/or a dielectric layer includes less than about 20 wt. % of HCl based on the total weight of the composition, less than about 15 wt. %, or less than about 10 wt. %. Referring to FIGS. 4A and 4B, graphs are shown that illustrate the etch rate of Ni (FIG. 4A) and Ni-germanide (FIG. 4B) using HCl:$H_2O$ etch compositions with different HCl concentrations.

Figure 5A:
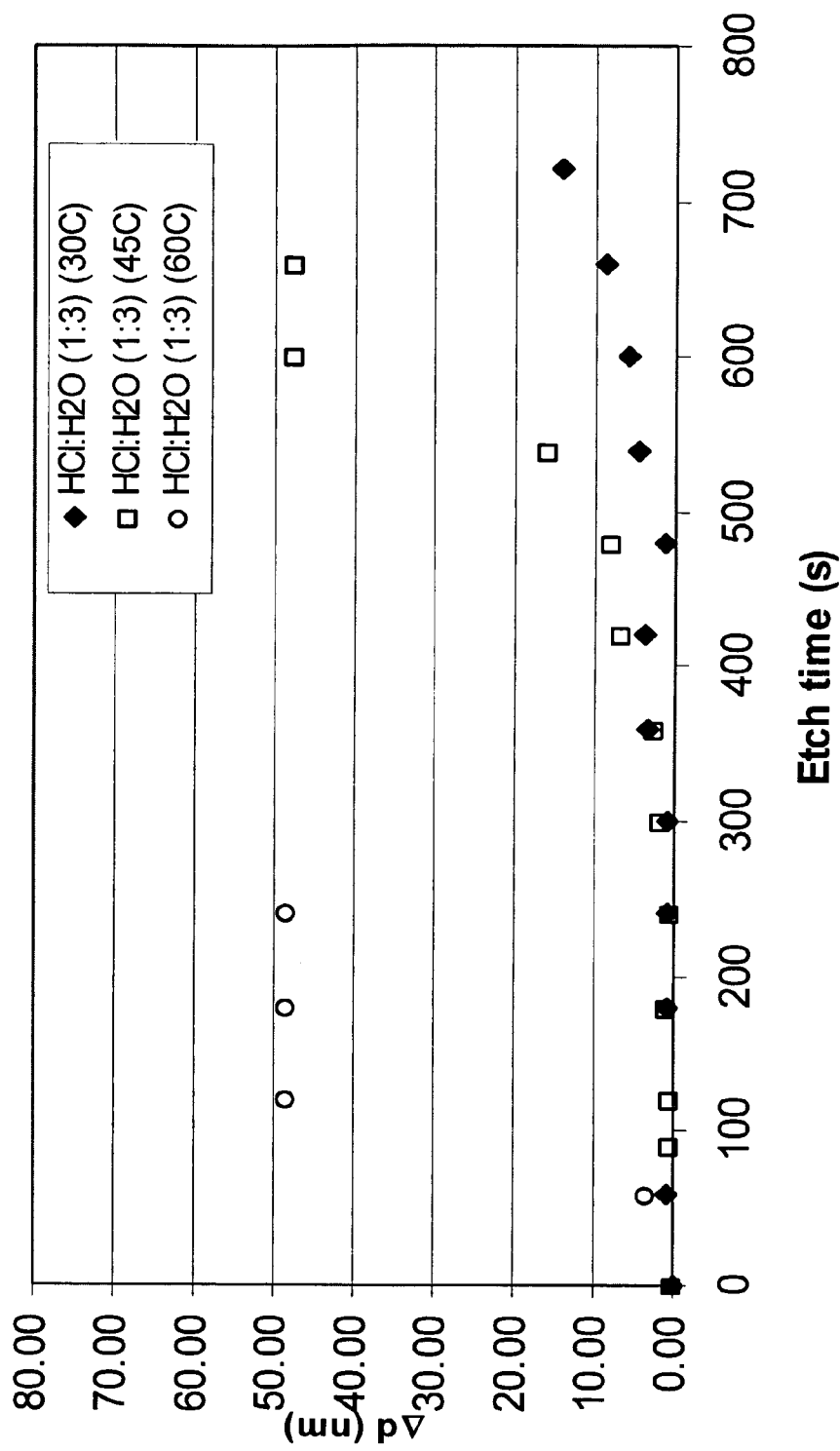
FIGS. 5A and 5B are graphs that illustrate the etch rate of Ni (FIG. 5A) and Ni-germanide (FIG. 5B) as a function of temperature using an $HCl:H_2O$ (1:3) composition.
Figure 5B:
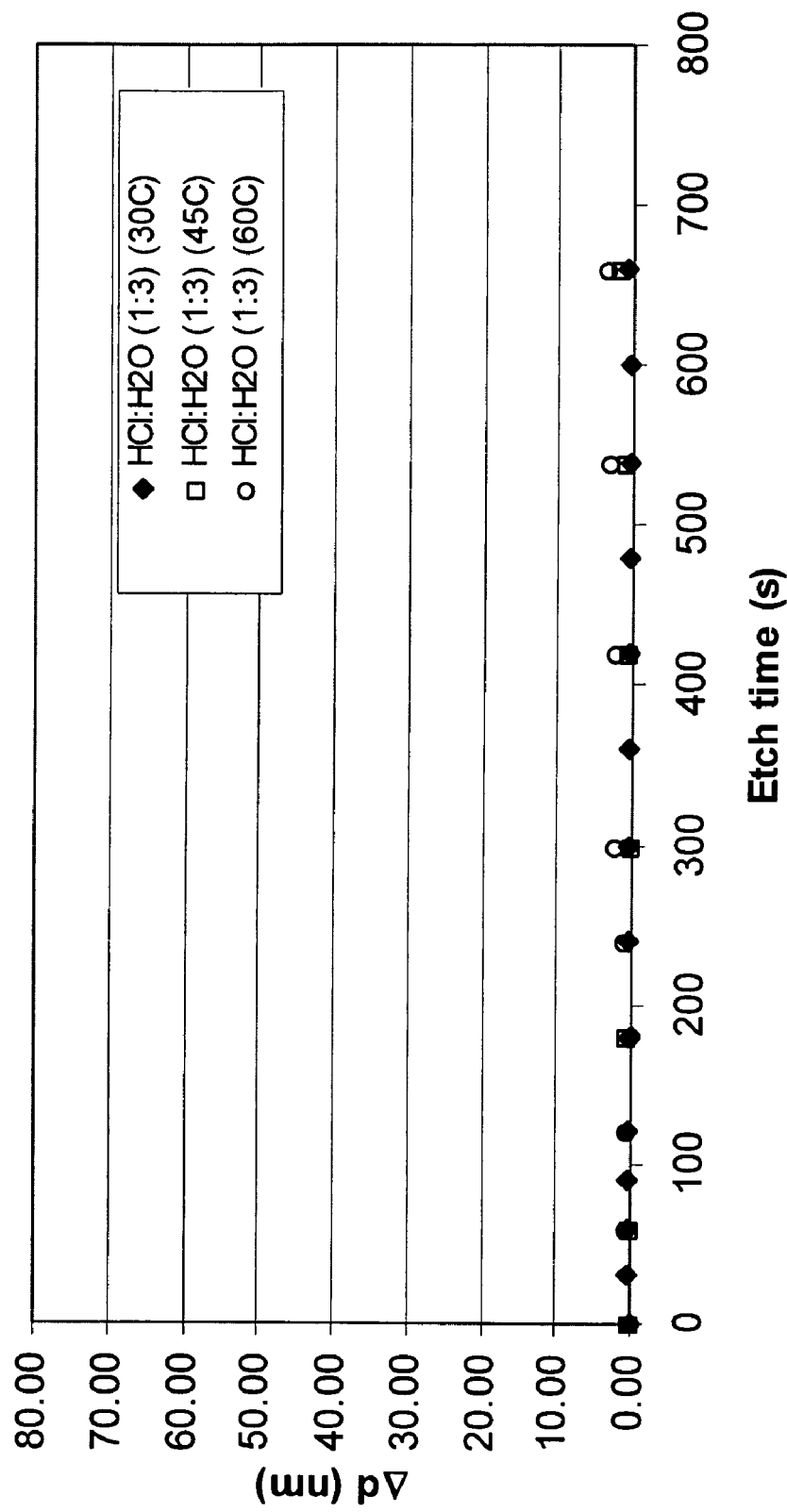
Figure 5C:
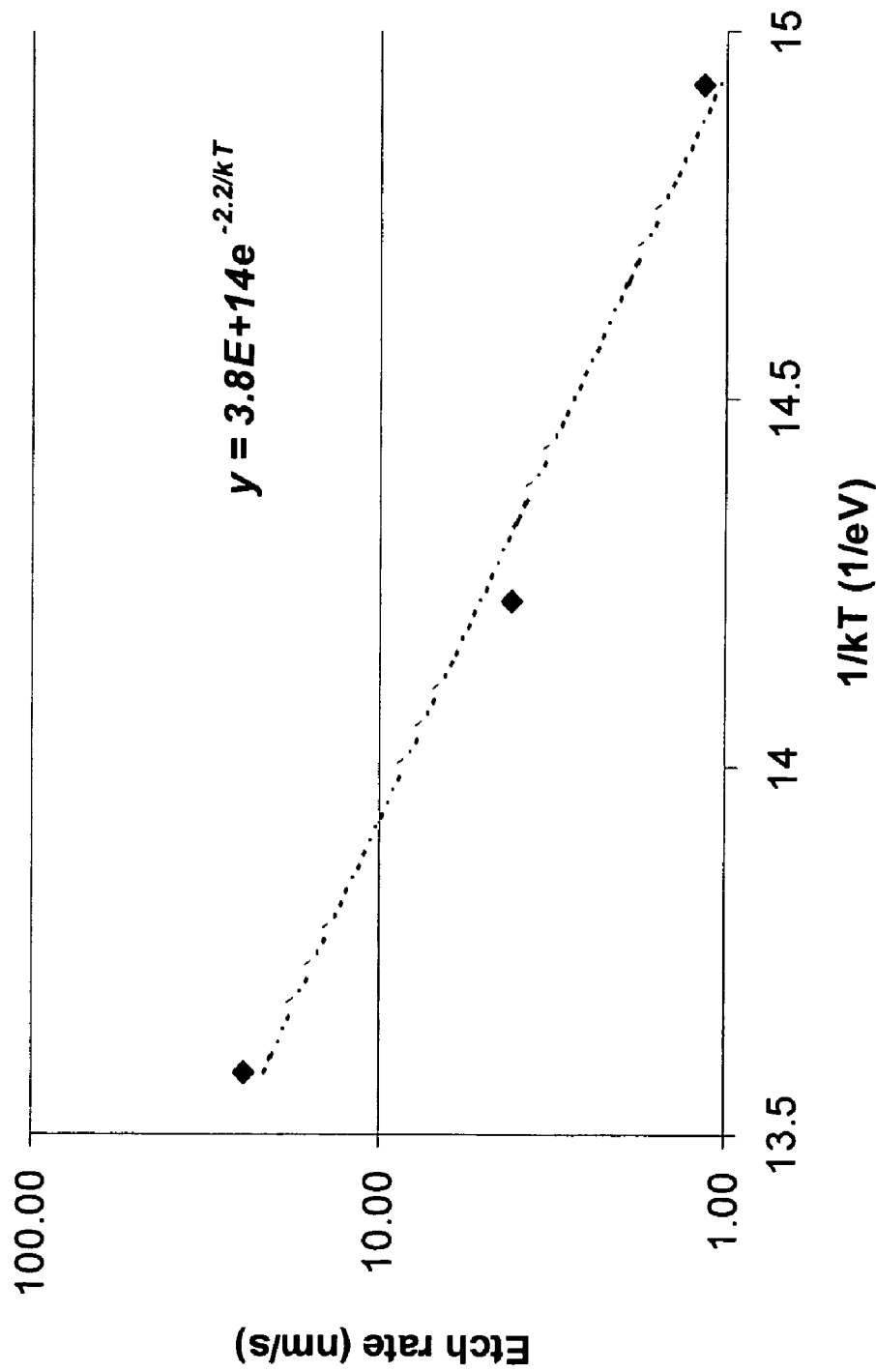
FIG. 5C is a graph that illustrates an Arhennius plot for selective etching of Ni using an $HCl:H_2O$ (1:3) composition.

Referring to FIGS. 5A and 5B, graphs are shown that illustrate the etch rate of Ni (FIG. 5A) and Ni-germanide (FIG. 5B) as a function of temperature in an HCl:$H_2O$ (1:3) composition. FIG. 5C shows an Arhennius plot of the selective etching of Nickel with an HCl:$H_2O$ (1:3) composition. The reaction when the metal is removed from the surface of the sample can be characterized by the activation energy Ea. The rate (r) of the reaction in which the metal is etched and dissolved in the etching composition may be expressed by the following equation:

$$r = A \exp(-E_a/kT)$$

Taking into account the temperature dependence of the reaction, it may be inferred that a high temperature will result in more dissolved metal in a given time period when $-Ea<0$. If $-Ea>0$, a lower temperature will result in more dissolved metal in a given time period. By plotting ln(r) versus T, a straight line is obtained in an ideal case, where the slope is equal to the activation energy. In this case (FIG. 5C), the value for Ea is 2.2 eV.

In another embodiment, a diluted and heated HCl:$H_2O$ mixture is used as an etching composition for the selective etching of Ni over Ni-germanide without substantially attacking the substrate or dielectric material. In a specific application, the etching composition includes 1 part HCl and 7 parts $H_2O$ and is heated to increase the etch rate of Nickel. The temperature of the composition may be between about 50° and about 75° C., such as 70° C. In empirical testing, the use of an HCl:$H_2O$ composition with a volumetric ratio of 1:7, at 60° C., removes substantially all unreacted Ni in about 120 seconds for a specific structure (with an initial thickness of 50 nm). This result is substantially the same as the etching rate with a 1:3 (HCl:$H_2O$) mixture for removal of Ni (e.g., unreacted Ni). However, with respect to etch selectivity: the 1:7 etch mixture has a much higher selectivity. For example, the etch selectivity of the 1:7 (HCl:$H_2O$) etch composition is 101 and the etch selectivity of the 1:3 (HCl:$H_2O$) etch composition is 78. In this context, etch selectivity may defined as the etch rate of unreacted metal (e.g., Ni) in nm/min. as compared to the etch rate of metal-germanide (e.g., Ni—Ge) in nm/min.

Figure 5D:
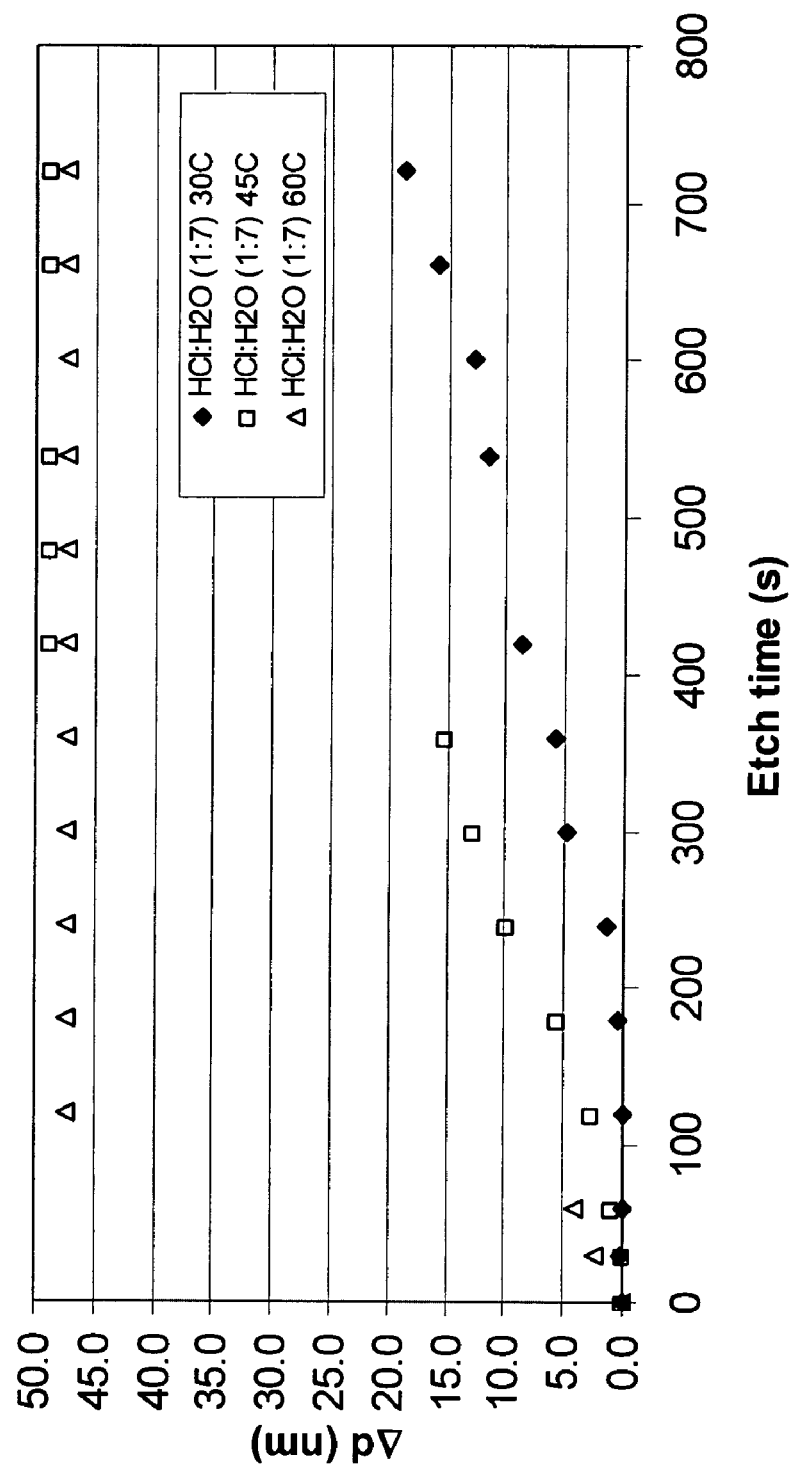
FIGS. 5D and 5E are graphs that illustrate the etch rate of Ni (FIG. 5D) and Ni-germanide (FIG. 5E) as a function of temperature using an $HCl:H_2O$ (1:7) composition.
Figure 5E:
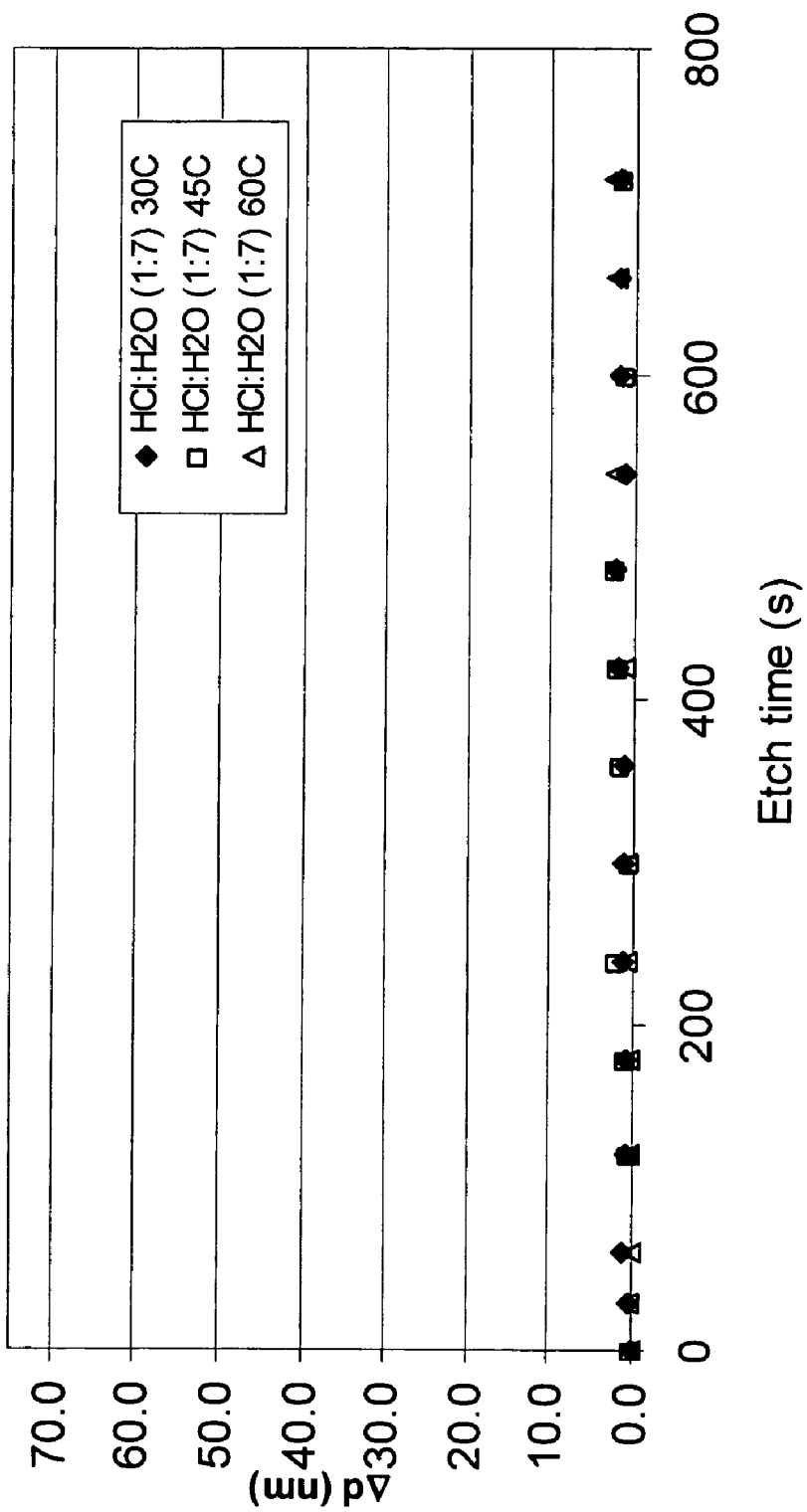
Figure 9:
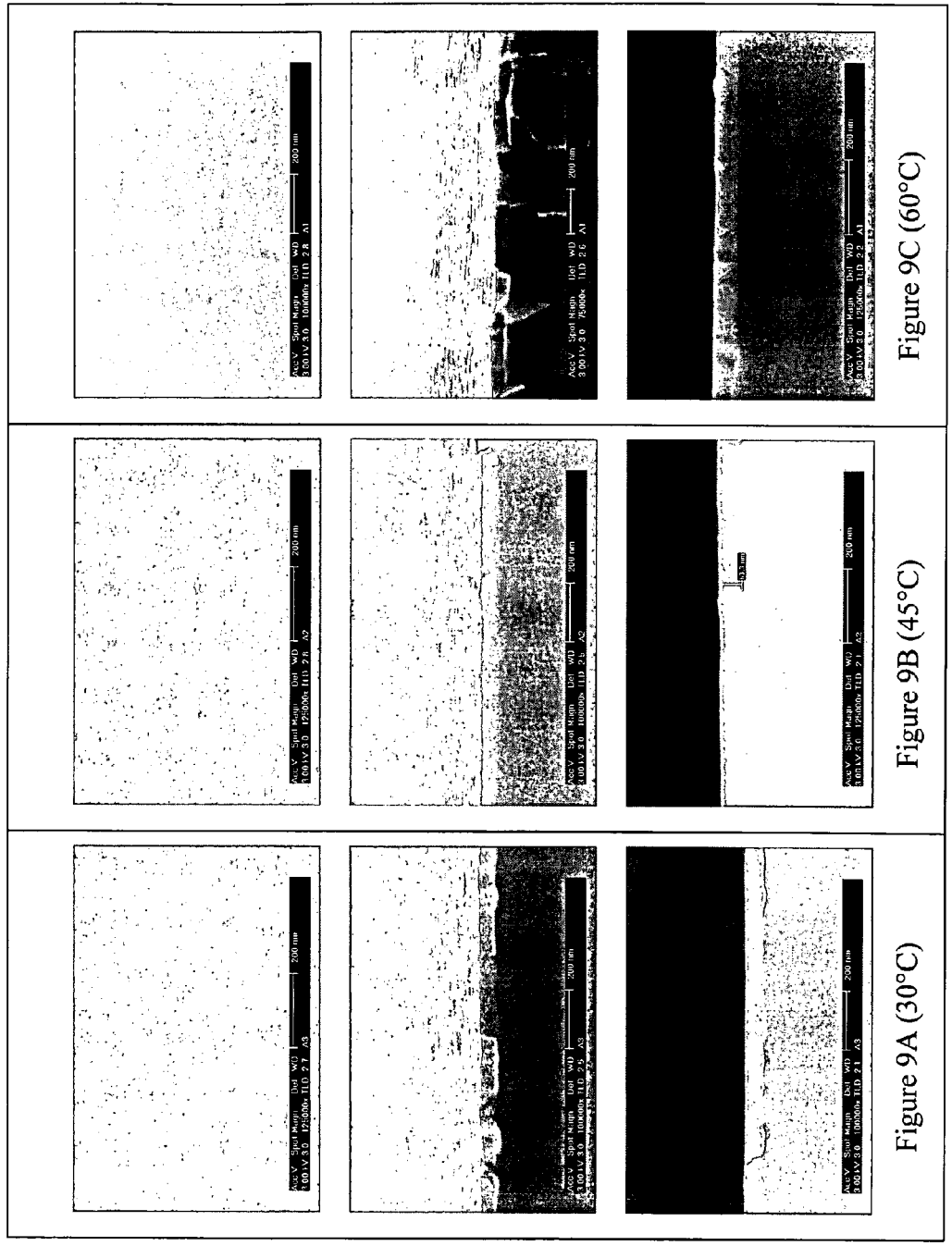
FIG. 9A-9C are SEM pictures that illustrate Ni-germanide surfaces that have been subjected to an $HCl:H_2O$ (1:3) composition at different temperatures.

FIGS. 5D and 5E, are graphs that illustrate the etch rate of Ni (FIG. 5D) and Ni-germanide (FIG. 5E) as a function of temperature using an HCl:$H_2O$ (1:7) composition. The Ni-germanide surface is not substantially damaged due to exposure to heated HCl solutions. For example, FIGS. 9A, 9B and 9C are SEM pictures that illustrate Ni-germanide surfaces that have been subjected to HCl:$H_2O$ 1:3 etch compositions at different temperatures. Specifically, FIG. 9A shows a Ni-germanide surface subjected to an HCl:$H_2O$ 1:3 etch composition at 30° C, FIG. 9B shows a Ni-germanide surface subjected to an HCl:$H_2O$ 1:3 etch composition at 45° C and FIG. 9C shows a Ni-germanide surface subjected to an HCl:$H_2O$ 1:3 etch composition at 60° C. As shown in FIGS. 9A-9C, no substantial damage to the NiGe surface was observed. While the NiGe surfaces shown in FIGS. 9A-9C were dipped in the etch compositions for 120 seconds, it is noted that even longer contact times did not substantially affect the NiGe surface.

In yet another embodiment, a composition for selectively removing one or more metals from a germanium layer, a germanide layer and/or a dielectric layer may also include (e.g., in combination with one of the compositions described above) less than about 50 wt. % of $H_2SO_4$, less than about 30 wt. % of $H_2SO_4$, or less than about 20 wt. % of $H_2SO_4$. As one example, a small amount of $H_2SO_4$ (e.g. less than 20 wt. %) is added to an HCl solution. The resulting composition may be used at temperatures lower than 50° C., such as at room temperature. Compared to an HCl:$H_2O$ composition that is also used at room temperature, compositions that further include $H_2SO_4$ result in a higher etch rate of unreacted Ni. Further, there is not a substantial difference in etch selectivity. Such an HCl:$H_2SO_4$:$H_2O$ composition may have a volumetric ratio of HCl to $H_2SO_4$ between 1:0.1 and 1:1, such as 1:0.5. Similarly, a particular HCl:$H_2SO_4$:$H_2O$ composition has a volumetric ratio of 1:0.5:3. This composition may be used to remove metal at temperatures between about 18° C. and about 50° C. It will be appreciated that at higher temperatures, e.g. 70° C., $H_2SO_4$ would etch NiGe. That is, the HCl:$H_2SO_4$:$H_2O$ (1:0.5:3) composition loses its selective etching properties at elevated temperatures.

Figure 6A:
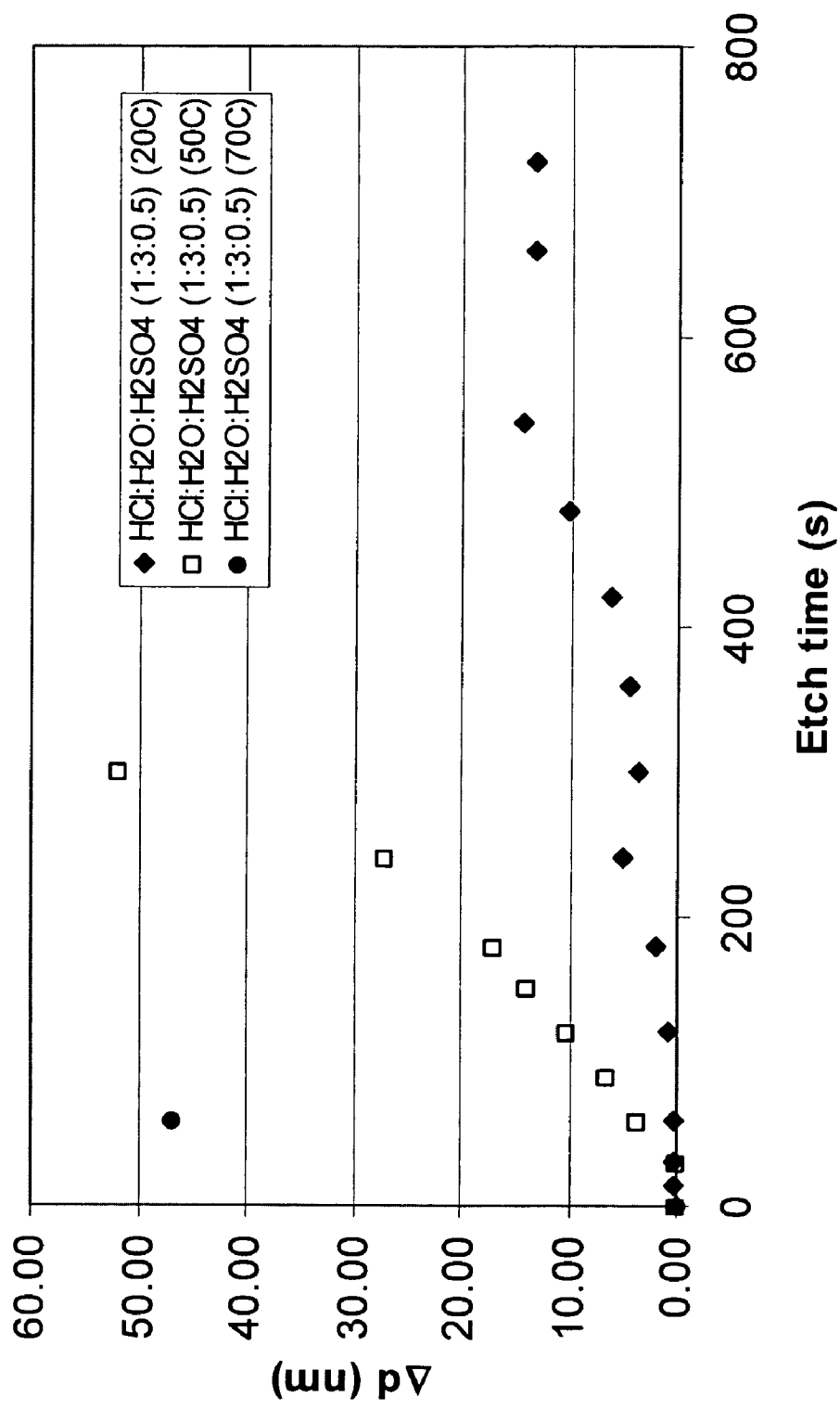
FIGS. 6A and 6B are graphs that illustrate the etch rate of Ni (FIG. 6A) and Ni-germanide (FIG. 6B) as a function of temperature using an $HCl:H_2SO_4:H_2O$ (1:0.5:3) composition.
Figure 6B:
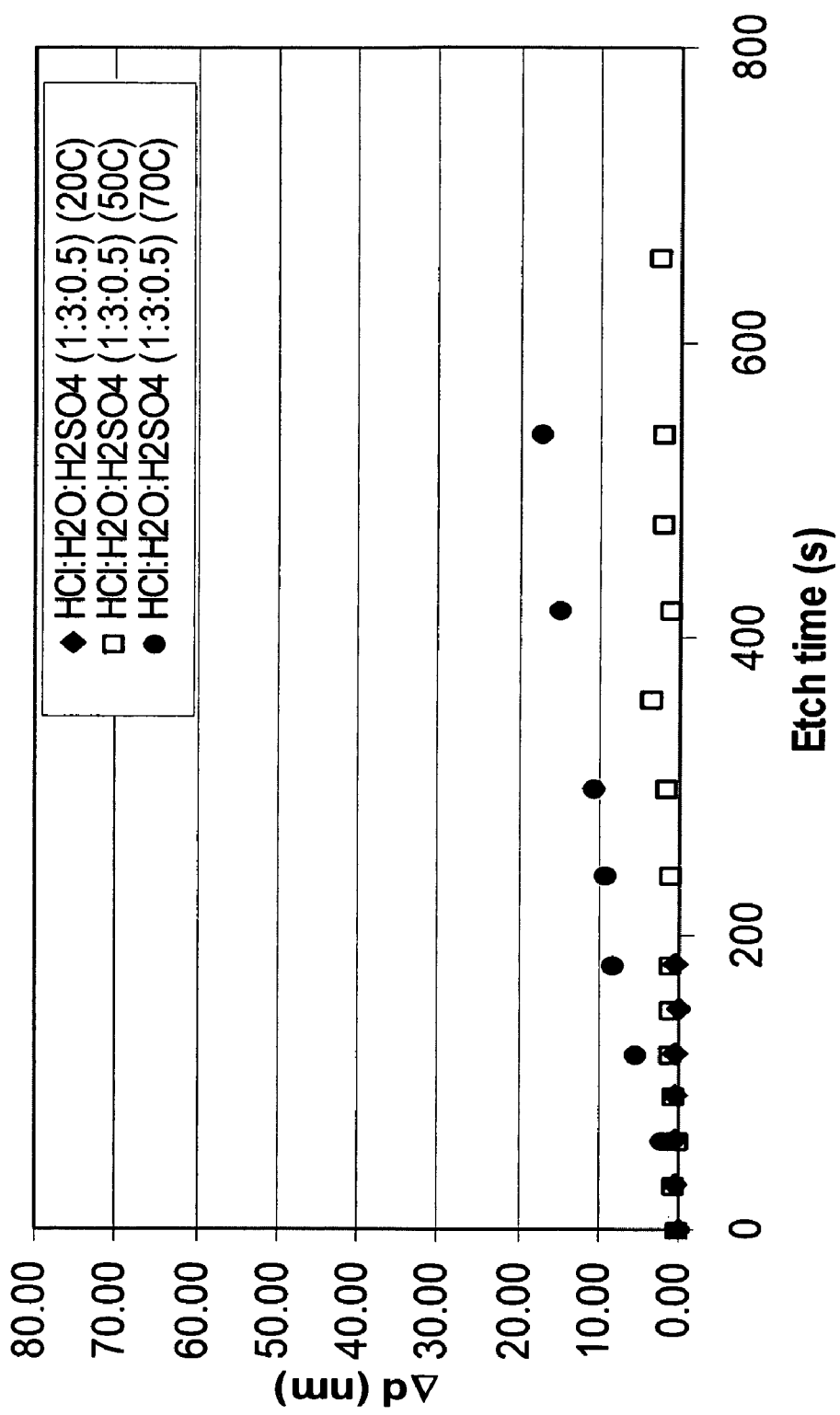
Figure 6C:
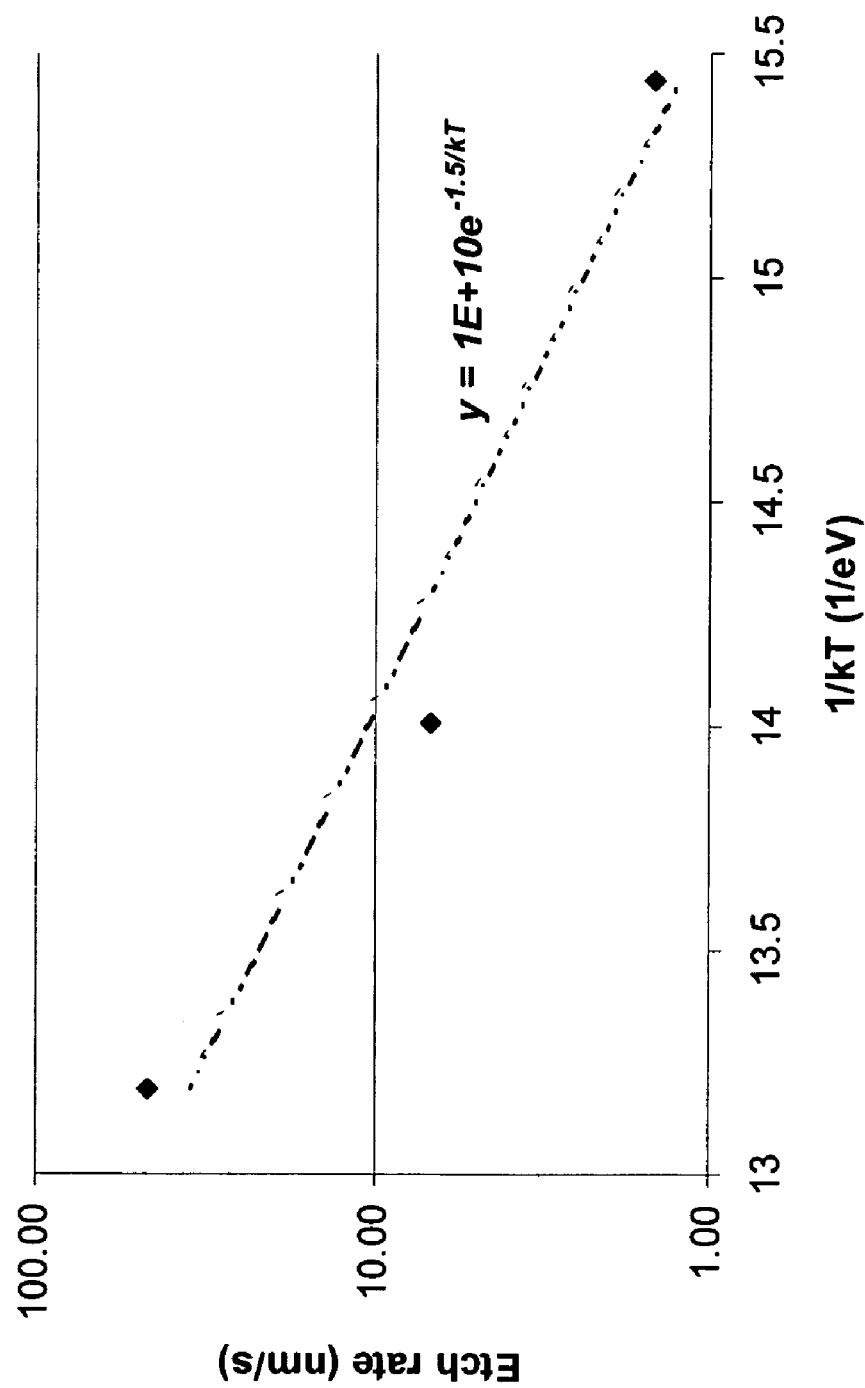
FIG. 6C is a graph of an Arhennius plot that illustrates selective etching of Ni using an $HCl:H_2SO_4:H_2O$ (1:0.5:3) composition.

Referring to FIGS. 6A and 6B, graphs are shown that illustrate the etch rate of Ni (FIG. 6A) and Ni-germanide (FIG. 6B) as a function of temperature in such an HCl:$H_2SO_4$:$H_2O$ (1:0.5:3) composition. Substantially all of the unreacted Ni (with an initial thickness of 50 nm) is removed after 60 sec. when etched at a temperature of 70° C. However, compared to FIG. 5B, etching of the Ni-germanide occurs due to the presence of higher temperature (70° C.) $H_2SO_4$, which is undesirable. FIG. 6C shows an Arhennius plot that illustrates the selective etching of Nickel with an HCl:$H_2SO_4$:$H_2O$ (1:0.5:3) composition. The value for Ea in this situation is 1.5 eV, which is lower than the Ea value obtained with an HCl:$H_2O$ (1:3) etch mixture. While certain etching compositions have been described above, it will be appreciated that any number of other compositions including one or more hydrohalides in various concentrations, with or without the addition of $H_2SO_4$ and/or other components are possible.

Methods for Forming Self-Aligned Germanides

Compositions, such as those described above, may be used for selectively removing unreacted metal(s) from a germanium layer, a germanide layer and/or a dielectric layer. Embodiments of such methods are now described.

In one embodiment for forming a self-aligned germanide, a composition including one or more hydrohalides is contacted with unreacted metal(s) at a temperature between about 20° C. and about 100° C., between about 50° C. and about 75° C., or between about 60° C. and about 70° C. The composition may further include the addition of $H_2SO_4$ but as described above, compositions including $H_2SO_4$ are typically not heated due to the loss of etch selectivity to germanium at higher temperatures.

The method includes providing a substrate having at least one region in which germanium is exposed. Metal, such as Ni, is deposited over at least the exposed germanium. The substrate is then heated to form a germanide. After forming the germanide, the unreacted metal is removed by contacting the substrate with a chemical composition, such as the compositions described above (e.g., including one or more hydrohalides, with or without the addition of $H_2SO_4$). The unreacted metal is selectively removed from the germanide, the substrate and/or dielectric materials that are present on the substrate.

Referring to FIGS. 1A-1D, cross-sectional diagrams are shown that illustrate a process flow for forming self-aligned germanides. As shown in FIG. 1A, a substrate 1 is provided which includes at least one region 3 formed in a germanium layer 2. The substrate 1 may be a bulk germanium wafer, in which case layer 2 is the bulk itself. Alternatively, the substrate 1 may be a germanium-on-insulator (GOI) wafer in which case the layer 2 is a germanium layer formed on a dielectric layer on top of the substrate 1. The germanium region 3 may also be formed by selectively depositing germanium on the substrate 1, at least within the region 3. More generally, the substrate 1 can take the form of any material on which such a germanium region 3 can be formed.

The germanium layer 2 can be a continuous layer that at least partially extends over the substrate 1 or, alternatively, the germanium layer 2 can be divided into separate regions 3. These regions 3 can then be insulated from other regions by field regions 4. The field regions 4 can be formed by etching grooves into the substrate 1 and filling the grooves with a dielectric material, such as an oxide. This insulation method is also known as shallow-trench-insulation (STI). As illustrated in FIG. 1B, a layer 5 of a metal, such as Ni, is deposited over the region 3 and the field regions 4. Within region 3 the deposited metal is in contact with germanium.

As illustrated by FIG. 1C, a heating step is performed that causes the metal 5 to react with the exposed germanium 3 to form a germanide 6 (a compound layer of the germanium 2 and the metal layer 5) at the interface between the germanium and the metal. As only part of the metal 5 reacts, unreacted metal 5 remains on at least the field regions 4, and may also remain on the germanide 6. As illustrated by FIG. 1D, substantially all of the unreacted metal 5 is removed by a selective wet etch, such as an etch using a chemical composition including one or more hydrohalides (which may also further include $H_2SO_4$), as were described above. This etch leaves the germanide layer 6 in region 3. The chemical composition is selective to at least the germanide layer 6. However, it is also desirable that the chemical composition also doesn't substantially affect the dielectric material of the field regions 4 and/or the germanium of the substrate 1, e.g. by forming $Ge_xO_y$, when in contact with the germanium.

Figure 2D:
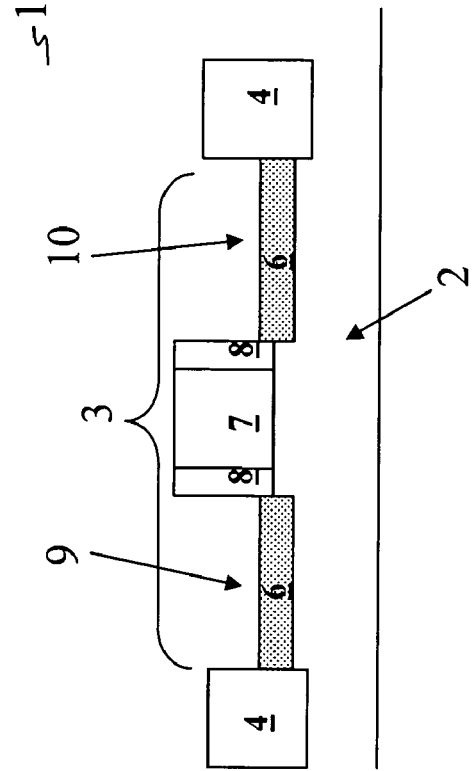
Figure 2A:
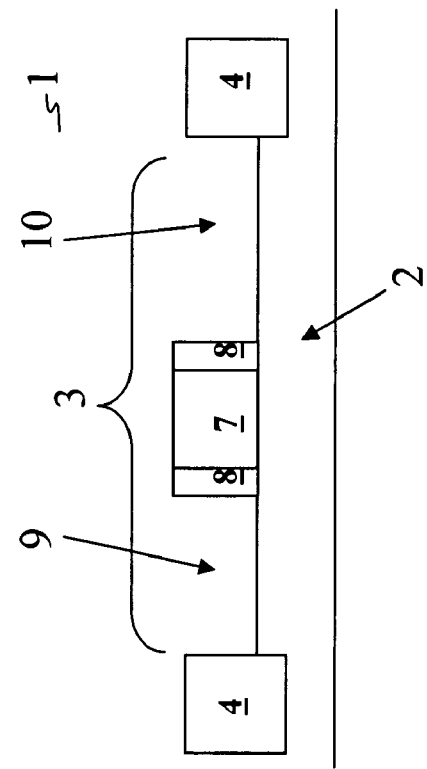

FIGS. 2A-2E illustrate another embodiment, which differs from the embodiment illustrated in FIGS. 1A-1D, in that a structure is present within region 3, as illustrated by FIG. 2A. This structure may be a gate electrode, such as in the case of a unipolar transistor (e.g., a MOSFET (metal-oxide-semiconductor field effect transistor)). The gate electrode in FIG. 2A includes a conductive material 7 that is surrounded by spacers 8. The spacers 8 are formed from a dielectric material. On opposite sides of this gate, a source region 9 and a drain 10 region are formed in the germanium layer 2. In the case of a bipolar transistor, this structure may be an emitter 7 and on opposite sides of the emitter 7 an external base region 9, 10 can be formed. The emitter 7 is insulated form the external base 9, 10 by the dielectric material 8. The dielectric material 8 may be an oxide, a nitride, an oxynitride such as SixOyNx where $x+y+z \leqq 1$, a silicon-carbide SiC or a siliconoxycarbide SixOyCx where $x+y+z \leqq 1$, as some examples.

Figure 2B:
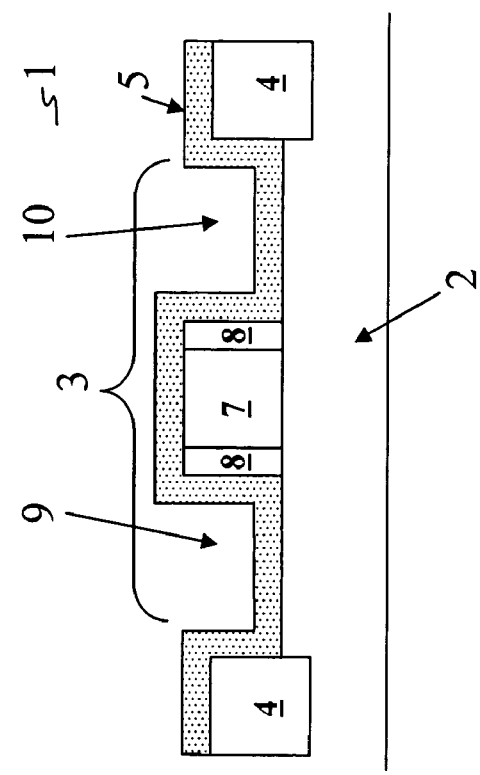

As illustrated in FIG. 2B, a layer 5 of a metal, such as Ni, is deposited over region 3 (the regions 9, 10 and the structure 7, 8). The layer 5 also overlies the field regions 4. Within the region 3, the deposited metal layer 5 is in contact with germanium. As illustrated by FIG. 2C, a heating step is performed which causes the metal layer 5 to react with the exposed germanium 3 to form a germanide 6 at the interface between the germanium and the metal. As only part of the metal layer 5 reacts, excess metal remains on top of the germanide 6 and on the field regions 4. As illustrated by FIG. 2C, germanide is not formed on top of layers 7 and 8.

As shown in FIG. 2D, substantially all unreacted metal of the layer 5 is removed by a selective wet etch, as has been previously described, which leaves the germanide layer 6 in region 3. The etch composition is selective to at least the germanide layer 6. However, it is also desirable that the etch composition also doesn't substantially affect the dielectric material of the field regions 4, the dielectric material 8 of the spacers and/or the germanium layer. The germanide is only formed in the regions 9 and 10 in which germanium was in contact with the metal layer 5.

Figure 2E:
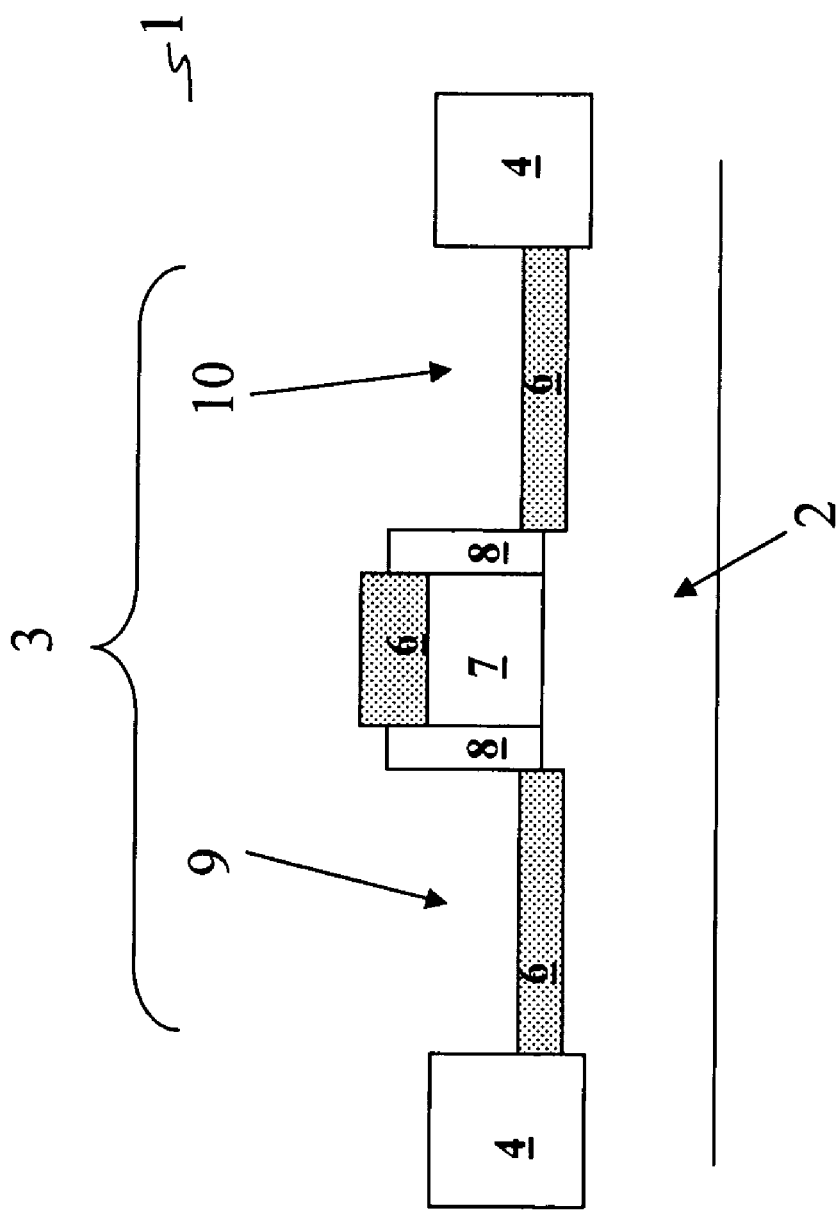

As shown in FIG. 2E, if the structure 7 is formed from germanium, the germanide layer 6 is also formed on top of the structure 7. In the case of an MOS transistor formed on a GOI layer 2 having a germanium gate 7, a NiGe layer 6 can be formed in the source region 9, the drain region 10 and on the gate 7. After forming the germanide layer 6, substantially all the unreacted metal (e.g., Ni) is removed from the substrate 1 using a single wet etch step that employs a chemical composition such as those described above. Thus, a self-aligned NiGe germanide is formed by this process.

Figure 3A:
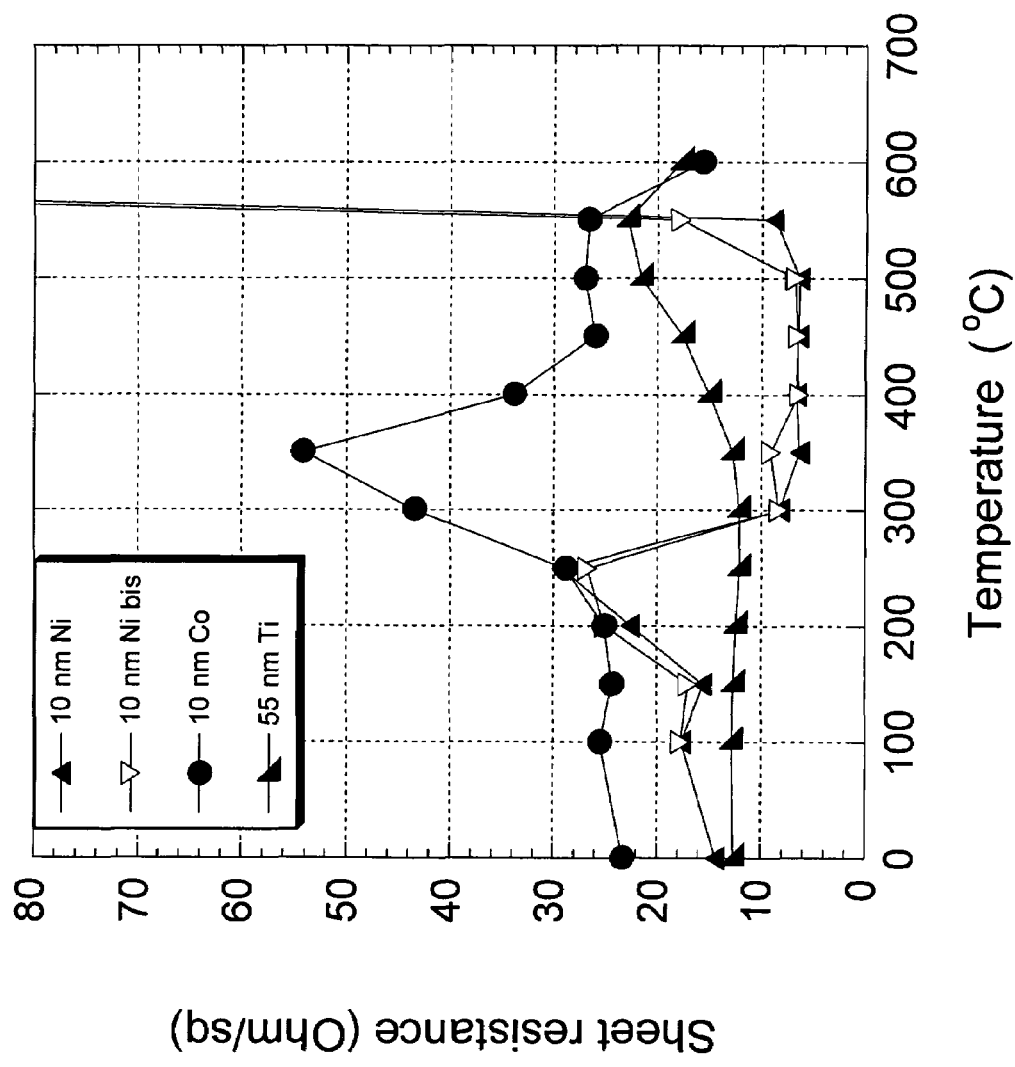
FIGS. 3A and 3B are graphs that illustrate sheet resistance as a function of annealing temperature for germanides formed on undoped germanium (FIG. 3A) and doped germanium (FIG. 3B)
Figure 3B:
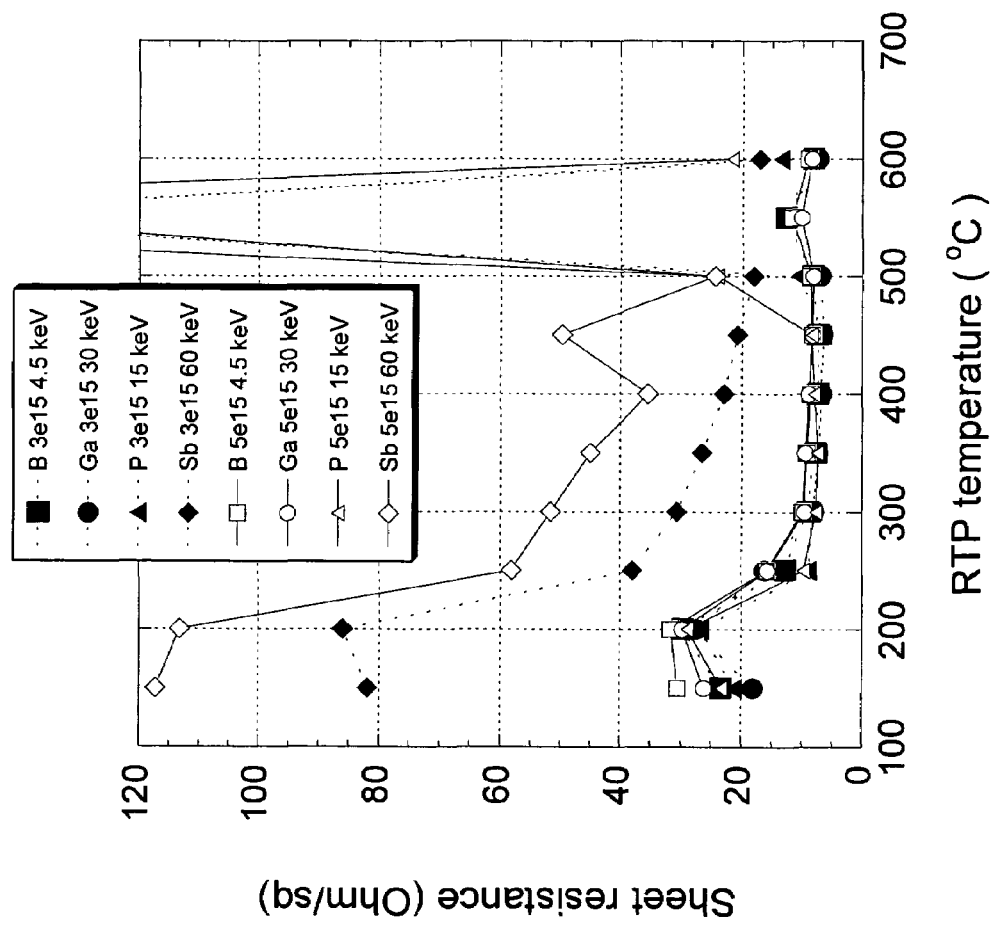

In another embodiment, a germanium layer 2 and either 10 nm of Ni, 10 nm of Co or 55 nm of Ti is deposited. The stack of germanium 2 and metal is then annealed for 30 sec. using rapid thermal annealing (RTA) in an inert gas atmosphere. The corresponding sheet resistance for stacks annealed at various temperatures is shown in graph form in FIG. 3A for the case of Ni, Co or Ti deposited on undoped germanium. FIG. 3B shows similar data for Ni deposited on germanium, doped with either Boron (B), Gallium (Ga), Phosphorus (P) or Antimony (Sb). The implant conditions (species, dose, energy) are indicated in FIG. 3B.

In yet another embodiment, a layer of Ni is deposited on a germanium layer. The stack of Ni and Ge is heated to a temperature between 300° C. and 600° C., such as between 350° C. and 450° C. The duration of this heating step is between 30 sec. and 10 minutes, such as between 30 sec. and 2 minutes. As is shown in FIG. 3A, in this temperature range, a low resistive NiGe layer 6 is formed that has a sheet resistance below 10 ohms/square. The unreacted Ni is then selectively removed at room temperature using a wet etch composition, such as one of those described above.

In still another embodiment, a stack of Ni and Ge is heated to a temperature between 150° C. and 200° C. The duration of this heating step is between 30 sec. and 10 minutes, such as between 30 sec. and 2 minutes. FIG. 3A illustrates that in this embodiment, a Ni-rich germanium layer is formed having a sheet resistance between 10 and 20 ohms/square. The unreacted Ni is removed at room temperature using a wet etch composition, as has been previously described. Thereafter, the Ni-rich germanium layer is converted into a NiGe germanide layer by heating the Ni-rich germanium layer to a temperature between 300° C. and 600° C., such as between 350° C. and 450° C. The duration of this heating step is between 30 sec. and 10 minutes, such as between 30 sec. and 2 minutes.

If dielectric materials such as an oxide, a nitride, an oxynitride such as $Si_xO_yN_z$ where $x+y+z \leqq 1$, a silicon-carbide SiC or a siliconoxycarbide $Si_xO_yC_z$ where $x+y+z \leqq 1$ (e.g., the field regions 4 and the spacers 8 in FIGS. 2A-2D), are present on the substrate 1, the etch composition desirably removes unreacted metal 5 with high selectivity to these dielectric materials. It is also desirable that the chemical etch composition does not include agents that oxidize (e.g., damage) the germanium layer 2. To avoid oxidation of germanium, concentrated $H_2SO_4$ at higher temperatures is not used because, as is known, concentrated $H_2SO_4$ oxidizes germanium at elevated temperatures. The wet etch composition can also comprise other additives to improve the etch selectivity or etch rate of the unreacted metal. However, when silicon-oxide dielectrics are employed, the use HF is not desirable as HF is aggressive in etching silicon-oxide.

Semiconductor Devices Comprising Self-Aligned Germanides

The methods described above may be carried out to obtain a semiconductor device that includes regions where a self-aligned germanide is formed by selectively removing unreacted metal using a composition (heated or not) that includes at least one hydrohalide, and may further include $H_2SO_4$ and/or other components. Such a device is characterized by the fact that no substantial attack of the germanide by the composition is observed and that, for example, more than 99% of the unreacted metal may be removed. Such a semiconductor device may be a MOSFET comprising a source region and a drain region that are formed in a germanium layer and/or with a gate formed in a germanium layer.

EMPIRICAL EXAMPLES

In the following examples, the etch compositions discussed are dilutions that were prepared from commercially available HCl, HF and $H_2SO_4$ solutions that are commonly used in VLSI processing. The HCl starting solution used was a 37 wt. % concentration solution, the $H_2SO_4$ starting solution was a 95-97 wt. % concentration solution and the HF starting solution was a 49 wt. % concentration solution.

Example 1

Different $HCl:H_2O$ Compositions and their Effect on Etching Selectivity and Etch Rate Different ratios of $HCl:H_2O$ ranging from 1:0 to 1:7 were tested at room temperature. It was determined that at room temperature, the etching rate for unreacted Ni increased with the HCl concentration. At room temperature, substantially all of the unreacted Ni (with an initial thickness of 50 nm) was removed in less than 60 seconds with an $HCl:H_2O$ composition having a volumetric ratio of 1:0. However, such high concentrations of HCl may attack (even if at very slow rate) the NiGe, as shown in the graph of FIG. 4B.

Example 2

Effect of Temperature on Etching Selectivity and Etch Rates $HCl:H_2O$ compositions having volumetric ratios of 1:3 and 1:7 were studied. These compositions were used at three different temperatures: room temperature, 45° C. and 60° C. to remove unreacted metal. FIG. 5A is a graph that illustrates the observed etch rates of unreacted Ni (removal of Ni as a function of time) at different temperatures for the 1:3 ratio composition. Substantially all of the unreacted Ni (with an initial thickness of 50 nm) is removed in 120 seconds at a temperature of 60° C., where the etch selectivity to Ni-germanide was 78.

FIG. 5D is a graph that illustrates the etch rates of unreacted Ni (removal of Ni as a function of time) at different temperatures for the 1:7 ratio $HCl:H_2O$ composition. Using this composition, substantially all of the unreacted Ni (with an initial thickness of 50 nm) is removed in 120 seconds at a temperature of 60° C., where the etch selectivity to Ni-germanide was 101.

FIGS. 5B and 5E are graphs that illustrate the etch rate of NiGe with these two etch compositions at different temperatures. FIGS. 9A-9C show SEM pictures of Ni-germanide surfaces subjected to the etch composition of a 1:3 ratio at different temperatures (FIGS. 9A, 9B and 9C respectively corresponding to 30° C., 45° C. and 60° C.) and show that substantially no damage was observed. From this, it may be concluded that for HCl concentrations lower than about 10 wt. %, based on the total weight of the composition, and independent of etch temperature, that Ni is selectively removed (etched) from NiGe. It may be also concluded from the foregoing that the selective etch rate may be improved by heating the etch composition without causing any substantial damage to the NiGe layer.

Example 3

Addition of $H_2SO_4$ to an $HCl:H_2O$ Etching Composition

FIG. 6A is a graph that illustrates the etching of unreacted Ni using an $HCl:H_2SO_4:H_2O$ composition with a volumetric ratio of 1:0.5:3. A comparison FIG. 5A and FIG. 6A demonstrates that the etch rate of unreacted Ni is higher with an $HCl:H_2SO_4:H_2O$ (1:0.5:3) composition than an $HCl:H_2O$ (1:3) composition. Also, as is shown in FIG. 6A, higher temperatures result in higher etch rates of unreacted Ni. However, as is shown in FIG. 6B, an $HCl:H_2SO_4:H_2O$ (1:0.5:3) composition at a temperature higher than about 50° C. is aggressive to NiGe, which is slowly etched.

Example 4

Use of $HF:H_2O$ Etching Compositions

Different $HF:H_2O$ compositions with volumetric ratios varying from 1:24.5 to 1:9 were tested. The results for selective removal (or selective etching) of unreacted Ni with an $HF:H_2O$ ratio of 1:24.5 and 1:9 are shown in FIG. 8A. As shown in FIG. 8A, the use of an HF:H$_2$O composition having a volumetric ratio of 1:9, at room temperature resulted in the removal of substantially all of the unreacted Ni (with an initial thickness of 50 nm) in about 360 seconds. FIG. 8B shows the etching rate of NiGe with the two different HF:H$_2$O compositions described above. From FIG. 8B, it may be concluded that there is no substantial attack of the germanide.

Example 5

Etch Selectivity of HCl:H$_2$O Mixtures

A lower concentration of HCl (e.g. HCl:H$_2$O composition having a ratio of 1:7 compared to a ratio of 1:3) showed improved selective removal (e.g., improved etch selectivity) of Ni, as is shown in the graphs of FIG. 4. The etch selectivity of an HCl:H$_2$O composition with a 1:7 ratio to NiGe is 101 compared to an etch selectivity of 78 for an HCl:H$_2$O composition with a 1:3 ratio. Table 1 below includes the etch selectivity values for the etch compositions and etch temperatures discussed above:

TABLE 1

| | Etch Selectivities | | |
| --- | --- | --- | --- |
| Temperature (° C.) | Etch rate Ni (nm/min.) | Etch rate Ni—Ge (nm/min.) | selectivity |
| HCl:H$_2$SO$_4$:H$_2$O (1:0.5:3) | | | |
| 20 | 1.48 | 0.20 | 7 |
| 50 | 6.77 | 0.65 | 10 |
| 70 | 46.65 | 1.90 | 25 |
| HCl:H$_2$O (1:3) | | | |
| 30 | 1.16 | 0.11 | 11 |
| 45 | 4.13 | 0.16 | 26 |
| 60 | 24.25 | 0.31 | 78 |
| HCl:H$_2$O (1:7) | | | |
| 30 | 1.56 | 0.16 | 10 |
| 45 | 4.06 | 0.18 | 22 |
| 60 | 23.66 | 0.24 | 101 |

Figure 10:
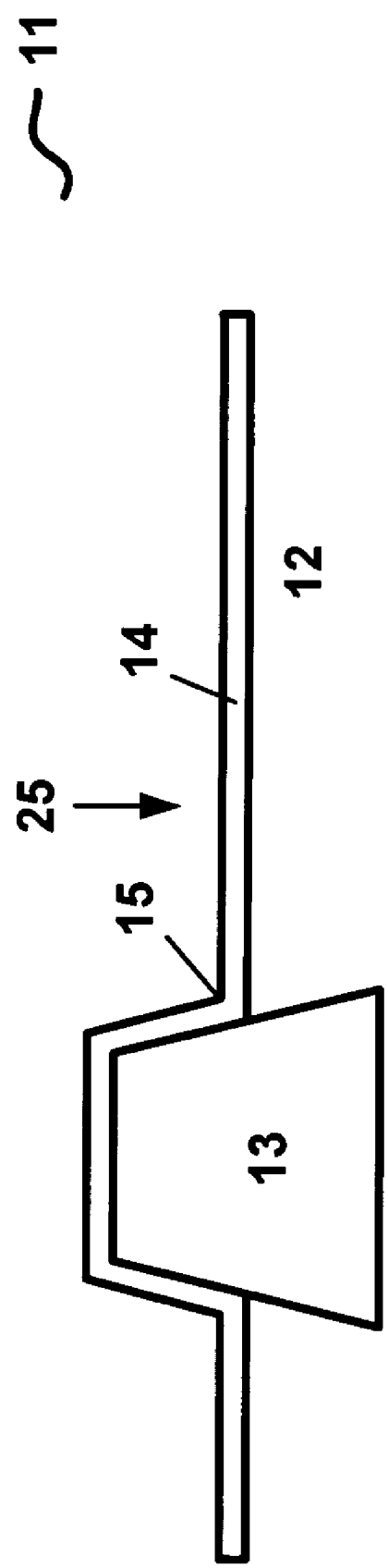
FIG. 10 shows cross-section of a germanium substrate illustrating a prior art nickel-germanide formation process.

In FIG. 10, a cross-section is shown of a germanium substrate comprising active areas and isolation regions illustrating a prior art nickel-germanide formation process. Over the germanium substrate 11, comprising active areas 12 and isolation regions 13, a nickel layer 14 is deposited. The substrate 11 is sufficiently heated to have the deposited nickel layer 14 and exposed germanium in the active areas 12 react to form a nickel-germanide layer 16. Thereafter, the unreacted nickel 14 is selectively removed.

Figure 11:
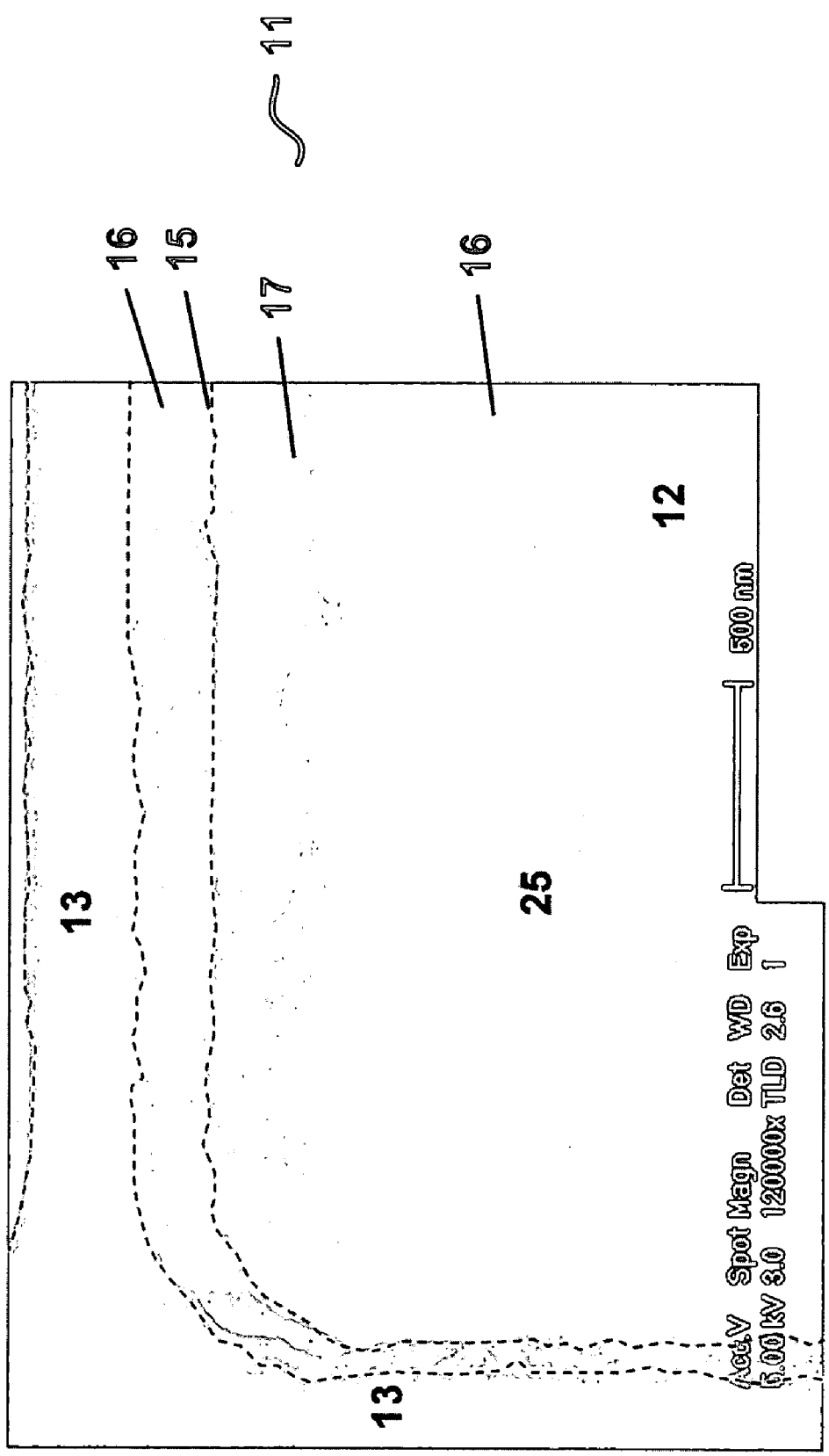
FIG. 11 shows a Scanning Electron Microscope (SEM) picture of a nickel-germanide formed at 360° C., 30 sec according to the prior art process illustrated in FIG. 10.

FIG. 11 shows a Scanning Electron Microscope (SEM) picture of a nickel-germanide layer formed on a patterned substrate 11 according to the prior art process illustrated in FIG. 10. Black dotted lines have been added to mark the contours of the dielectric region 13. About 10 nm of Nickel 14 was deposited on a substrate 11 containing exposed germanium surfaces 12 bordered 25 by a dielectric region 13. This substrate was then heated to about 360° C. for about 30 sec. Unreacted nickel 14 was selectively wet etched from the substrate 11.

This picture was taken from the germanided surface of the substrate 11, which was tilted to 35°. This picture clearly shows the pits 17 created in the active area 12 near 25 the isolation regions 13, while the germanide 16 in the center 25 of the germanium region 12 remote from the edge 15 seems to be defect-free. Note the large number of defects, including pits, in the active germanium layer 12 near the border with the dielectric region 13 and germanide 16 overgrowth on the isolation 13. The germanide 16 is also formed on the isolation regions 13 as shown by the crystal grains formed on the insulating dielectric.

Reducing the temperature at which the final germanide layer 16 is formed might reduce number and/or size of defects, but not necessarily eliminate these defects. Moreover, reducing the formation temperature of the final germanide layer 16 can result in the germanide resistance being too high for acceptable device performance. Experiments have shown that the phenomena of pit formation and germanide overgrowth occur after thermally processing the nickel-covered germanium substrate 11. The distribution of the pits 17 and the degree of germanide overgrowth over isolation regions 13 at the active area edge 15 depends on the location of the active area 12, in particular on the position of this edge 15, on the germanium substrate 11. Typically, the defects are formed in the germanium region 12 near the transition from germanium 12 to dielectric 13.

Figure 12:
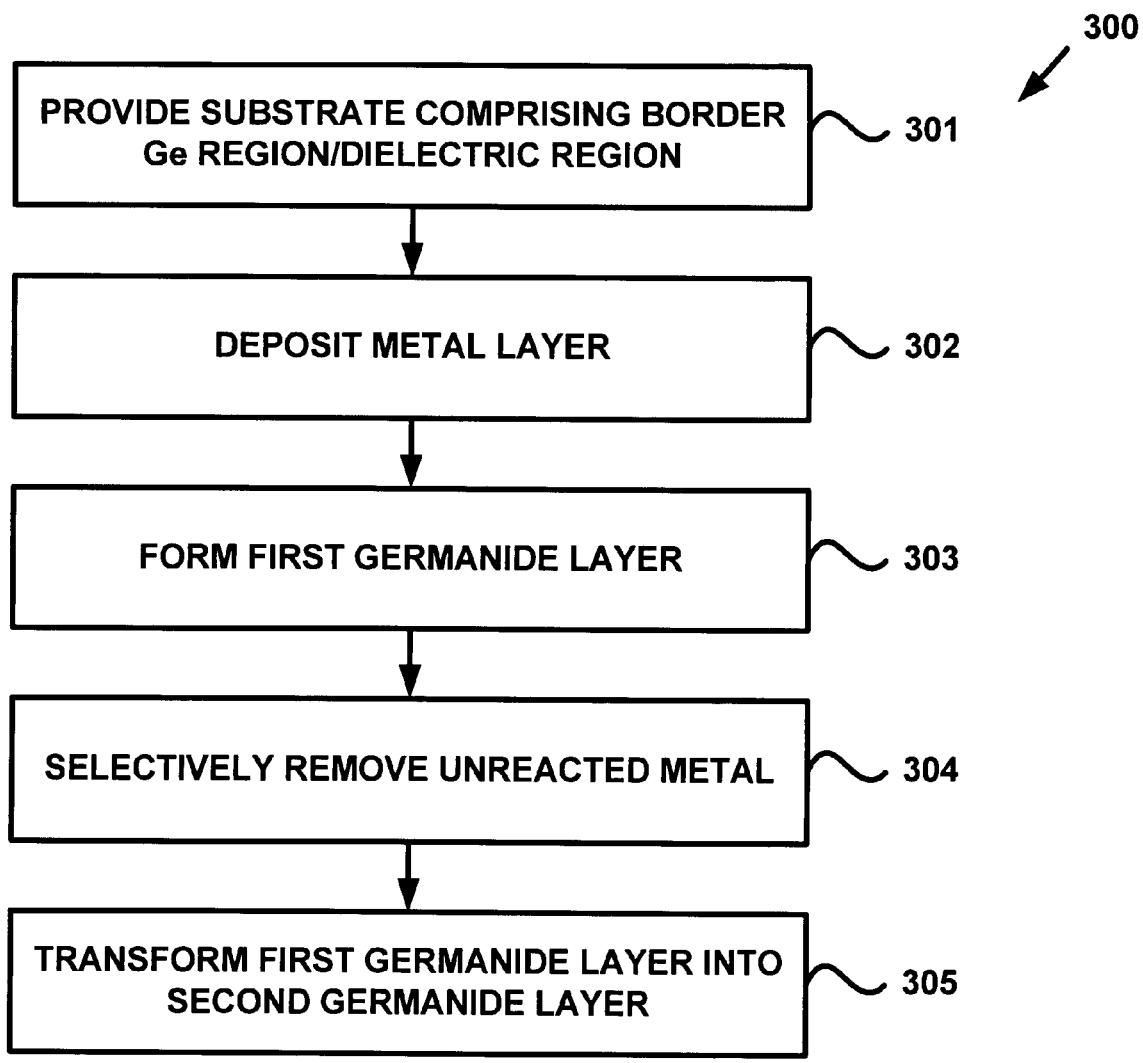
FIG. 12 is a flowchart illustrating a germanide-forming process according to an embodiment of the invention.

FIG. 12 is a flowchart illustrating a process 300 for forming a germanide layer according to an embodiment.

In block 301, a germanium-based substrate 11 is provided. This substrate 11 can be any substrate with a Ge-based active layer 12, including bulk germanium wafers, germanium-on-insulator wafers, and deposited Ge layers 12 on other substrates like silicon. This substrate 11 further comprises a dielectric pattern 13, 24 bordering the germanium layer 12. More generally, this germanium-based substrate 11 can be any substrate comprising an exposed germanium region 12 bordering a dielectric region 13. A height difference may exist between the exposed surfaces of the germanium region 12 and the dielectric region 13, 24. This substrate 11 can be a patterned wafer comprising germanium active areas 12 separated by isolation regions 13.

The isolation regions 13, also known as field isolation regions, can be formed by one of several techniques such as box isolation or shallow-trench-isolation (STI). In case of box isolation, openings are formed, by dry or wet etch, in an oxide layer 13 overlying a germanium layer to expose regions 12 of this germanium layer. In the case of shallow-trench-isolation, grooves 13 formed by dry-etch in the substrate 11 are filled with a dielectric layer providing electrical insulation.

The germanium can be in an amorphous or crystalline state. The germanium of the exposed region 12 can comprise some amount of silicon of other materials. If the germanium region 12 is formed by means of the germanium condensation technique, typically, up to about 15% silicon can be present in the thus formed germanium layer. U.S. Patent Application Publication No. 2003/0006461 discloses a method of germanium condensation, and is hereby incorporated by reference in its entirety.

The germanium active area 12 can comprise one or more semiconductor devices. If the semiconductor device is a field-effect-transistor, the germanium active area 12 may comprise a stack of a gate electrode and a gate dielectric. This gate stack is formed on the germanium substrate, thereby, defining the channel region. The gate dielectric can be an oxide, a nitrided oxide, an oxynitride or a high-k dielectric such as a hafnium oxide or an aluminum oxide. The gate electrode can be formed from a semiconductor material such as polysilicon, silicon-germanium, germanium, or from a metallic material such as TiN, TaN, and W.

The gate electrode separates in a lateral direction the source electrode and the drain electrode, which contact at opposite lateral sides the channel region. Against the gate stack, dielectric sidewall spacers can be formed to offset the source and drain regions from the channel region. These sidewall spacers can be formed for example from silicon-oxide, silicon-nitride, and/or silicon-carbide.

In block 302, a metal layer 14 is deposited over the substrate 11. The metal layer 14 can be comprised of nickel or nickel-based alloys. Preferably, the metal layer 14 is nickel or a nickel-based alloy. With nickel-based alloys is meant an alloy comprising about 50% or more nickel. The metal layer 14 can be deposited using chemical vapor deposition, sputter deposition, or other layer deposition techniques known in the art. The thickness $T_{14}$ of the metal layer 14 is selected to obtain after completion of the germanide-forming process a germanide layer 16 with the desired thickness $T_{16}$.

In block 303, a first thermal budget is supplied to the substrate 11 during a first thermal process step. This first thermal budget is selected to form a first germanide layer by reaction of the germanium in contact with the metal 14. As disclosed by S. Gaudet et al. in "Thin film reaction of transition metals with germanium," in Journal of Vacuum Science Technology, A24 (3) May/June 2006, hereby incorporated by reference in its entirety, germanide phases with different metal-to-germanium ratios can be formed simultaneously at the same temperature even for thin deposited metal layers. This behavior is unlike the formation of a thin film silicide, i.e., the reaction between silicon and a transition metal, whereby different silicide phases typically form subsequently with increasing temperature and substantially only the desired low-resistance silicide phase is formed at the selected process temperature.

During the thermal process step, germanium and metal diffuse to react with each-other. The pits 17 in the germanium region 12 shown in FIG. 11 indicate that germanium is transported from the germanium layer towards to the metal layer 14 when forming a germanide 16, 18. However, the respective diffusion process depends inter alia on the germanide phase through which the reacting species have to diffuse or on local stress of mechanical or thermal nature. When forming a nickel silicide, nickel will be the moving species. Thus, for thin metal layers, relevant for microelectronics processing, Ge diffusion and germanide formation in the presence of excess Ni is fundamentally different than that of Si diffusion and silicide formation in the presence of excess Ni. For this reason, Ni silicidation concepts and solutions do not necessarily apply to Ni germanidation.

The first thermal budget is selected to convert substantially the entire deposited metal layer 14 into a germanide layer 18 in regions of the active area 12 distant from the edge 15. This first-formed germanide layer should be comprised of predominantly metal-rich phase(s), for which the metal-to-germanium ratio in the phase is greater than 1. At least in the inner regions of the active area 12, the metal 14 deposited is substantially completely consumed leaving predominantly a metal-germanium alloy layer 18. Near the edges 15 of the active area 12, unreacted metal 14 remains, at least on the dielectric regions 13. Typically, this metal-germanium alloy layer 18 comprises metal-rich germanide phases having a high resistivity, i.e., a resistivity that is higher than the resistivity of the final germanide layer 16.

The parameters of the first thermal process step: time and temperature, are selected to result in a germanide-forming process that is uniform over the exposed germanium surface, e.g., the source and drain regions 23, such that at every position in the source and drain regions 23 substantially equal amounts of germanium are consumed. The thermal budget of the first thermal step should be preferably selected to be somewhat higher than the thermal budget needed to convert, in center regions 25 offset from the edges 15, essentially all metal 14 with deposited thickness $T_{14}$ into a germanide.

However, the first thermal budget should not be so high as to result in significant germanidation high onto the sides of, or over, the dielectrics in the isolation 13 and spacer 24 regions. The level of the germanide layer 18 formed on the exposed germanium surface adjacent the germanium/dielectric border 15 should only be slightly above the level $T_{18}$ of the germanide layer 18 in the center of the exposed germanium surface. If the first thermal budget is too high, the pits 17 are formed in the active germanium, as germanium from the source and drain regions 23 react non-uniformly with metal 14 high on the sides of, or over, the dielectrics 13 and 24. Additionally, this undesired, excessive germanidation near the edges 15 could result in excessive leakage currents due to insufficient isolation between adjacent active areas 12.

A limited margin on the germanide-forming process can be allowed to accommodate for variations of the metal layer 14 thickness over the wafer or for variations in the first thermal budget. The amount of germanium present on the isolation regions 13 above the average level of the germanide layer 18 should be limited as this excess germanium amount is indicative for differences in germanium consumption between central regions and edge regions 15 of the active area 12. This first thermal budget can be provided during a Rapid Thermal Processing (RTP) step, such as spike anneal or Rapid Thermal Anneal (RTA).

In block 304, the unreacted metal 15 is selectively removed from the substrate 11 without affecting the germanide formed, the dielectrics exposed, or the substrate itself. Hereto, the wet etch chemicals disclosed in U.S. Pat. No. 6,703,291, hereby incorporated by reference in its entirety, or the method of removing unreacted metal described herein can be applied.

In block 305, a second thermal budget is supplied to the substrate 11 during a second thermal process step. This second thermal budget is selected to form a second germanide layer 16 starting from the first germanide layer 18. Preferably, the germanide phases in this second germanide layer 16 have a metal-to-germanium ratio which is less than the ratio of the phases in the first germanide layer 18.

In this second thermal process step, the first germanide layer 18 with a higher resistivity is converted into a germanide layer 16 with a lower resistivity. The thermal budget should be high enough to allow conversion but low enough to avoid agglomeration of the metal in the germanide layer 16. If the thermal budget is too high, the interface between the germanide layer 16 and the germanium substrate becomes rough and distorted. Likewise, the exposed surface of the germanide layer 16 will become uneven.

The thermal budget of the second thermal process step is, thus, selected to be sufficient for converting a higher resistance germanide layer 18 into a lower resistance germanide layer 16. The second thermal budget should be low enough to maintain a substantially planar interface between the second germanide layer 16 and the germanium substrate 11. When selecting the second thermal budget, care should be taken such that excessive quantities of metal of the germanide layer do not dissolve in the underlying germanium 11. This phenomenon is discussed in the case of nickel as germanide forming metal by E. Simoen et al. in "Deep level transient spectroscopy study of nickel-germanide Schottky barriers on n-type germanium," in Applied Physics. Letter. 88, 183506 (2006), hereby incorporated by reference in its entirety. In this publication, the indiffusion of nickel from the nickel-germanide region to the germanium substrate is studied as function of temperature. For temperatures up to 450° C. only minor amounts of Nickel would diffuse from the germanide 16 to the underlying germanium 12. This second thermal budget can be provided during a Rapid Thermal Processing (RTP) step, such as laser anneal or Rapid Thermal Anneal (RTA).

FIGS. 13a-d illustrates the process flow of FIG. 12 when nickel is used as metal 14 to form a nickel germanide 16. Cross-sectional schematic views of subsequent process steps are given.

Figure 13A:
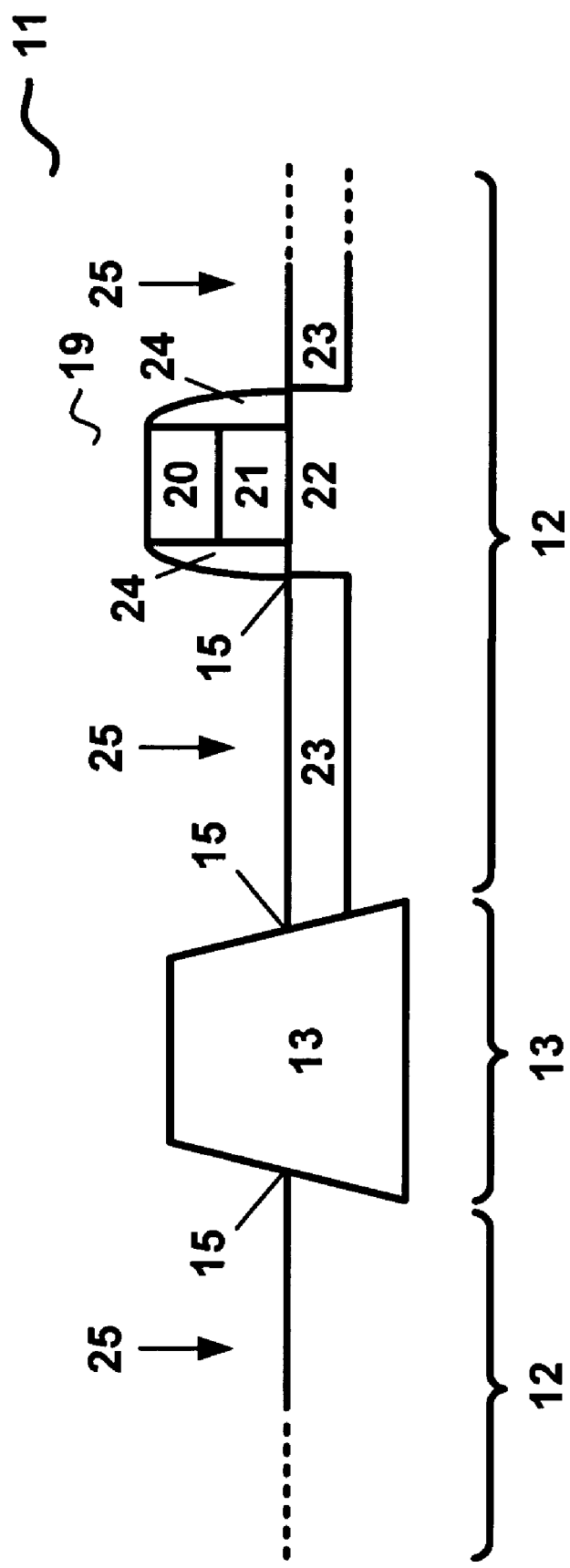
FIGS. 13a-d illustrate a process flow according to an embodiment by cross-sectional schematic views of subsequent process steps.

FIG. 13a shows a cross-section of an integrated circuit formed on germanium substrate 11 comprising two active areas 12 separated by a dielectric region 13. One active area (right) 12 comprises a field effect transistor 19 having a stack of a gate electrode 20 and gate dielectric 21 aligned to the channel region 22. Another active area (left) 12 does not comprise a transistor. Source and drain regions 23 are formed in the active area 12 to provide electrical access to the channel region 22. Adjacent to the gate stack 20, 21, sidewall spacers 24 are formed. Edges 15 of the active area 12 with the dielectric regions 13 and 24 are indicated.

The germanium regions 12 can be isolated from each-other using the box isolation technique resulting in a trapezoid shaped dielectric region 13 above the plane of the source/drain regions 23 with a bottom angle of less than 90° or by STI isolation resulting in a trapezoid shaped dielectric region 13 extending through the plane of the source/drain regions 23 with a bottom angle of 90° or slightly above. In FIG. 13a, one can distinguish two transitions from germanium 12 to dielectric material: a first transition is the edge 15 between the germanium 12 and the insulating dielectric region 13, while a second transition is the edge 15 between the germanium 12 and the dielectric spacer 24.

Figure 13B:
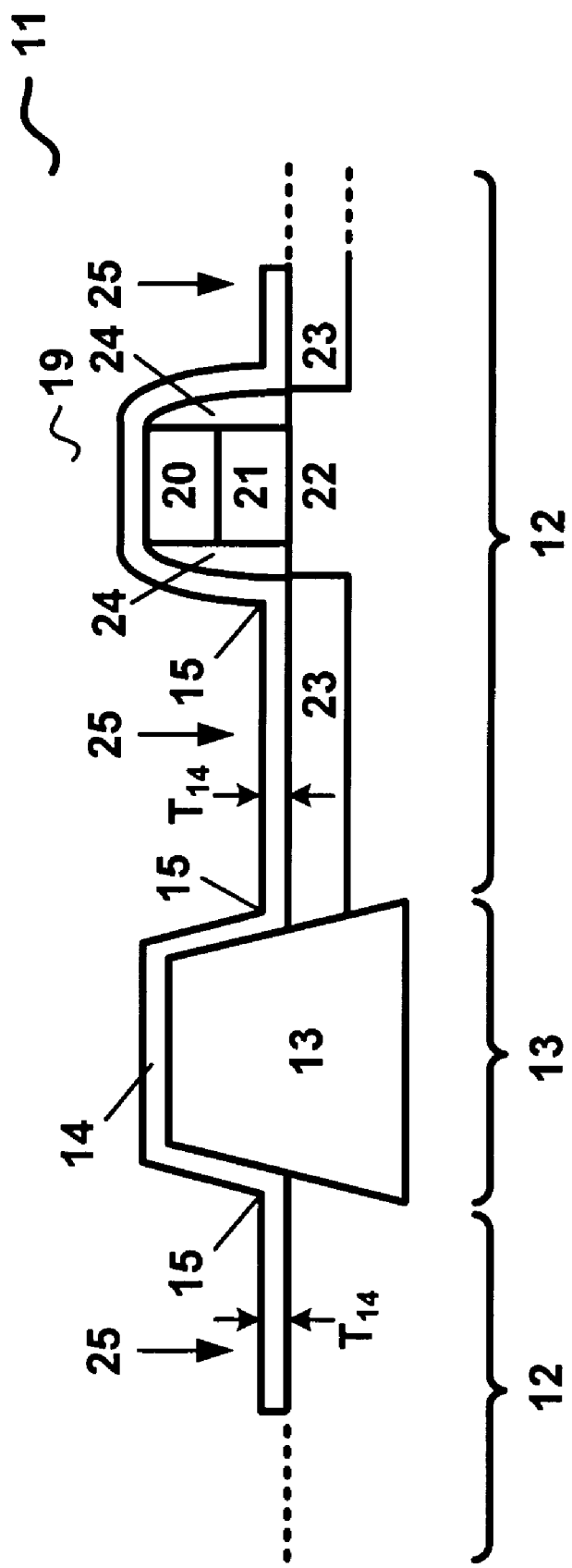

FIG. 13b shows a cross-section of the germanium substrate 11 of FIG. 13a after a nickel layer 14 has been deposited. The thickness $T_{14}$ of this nickel layer can be in the range of 5 to 25 nm, preferably in the range of 5 to 15 nm. Nickel can be deposited by vapor deposition or by sputtering.

Figure 13C:
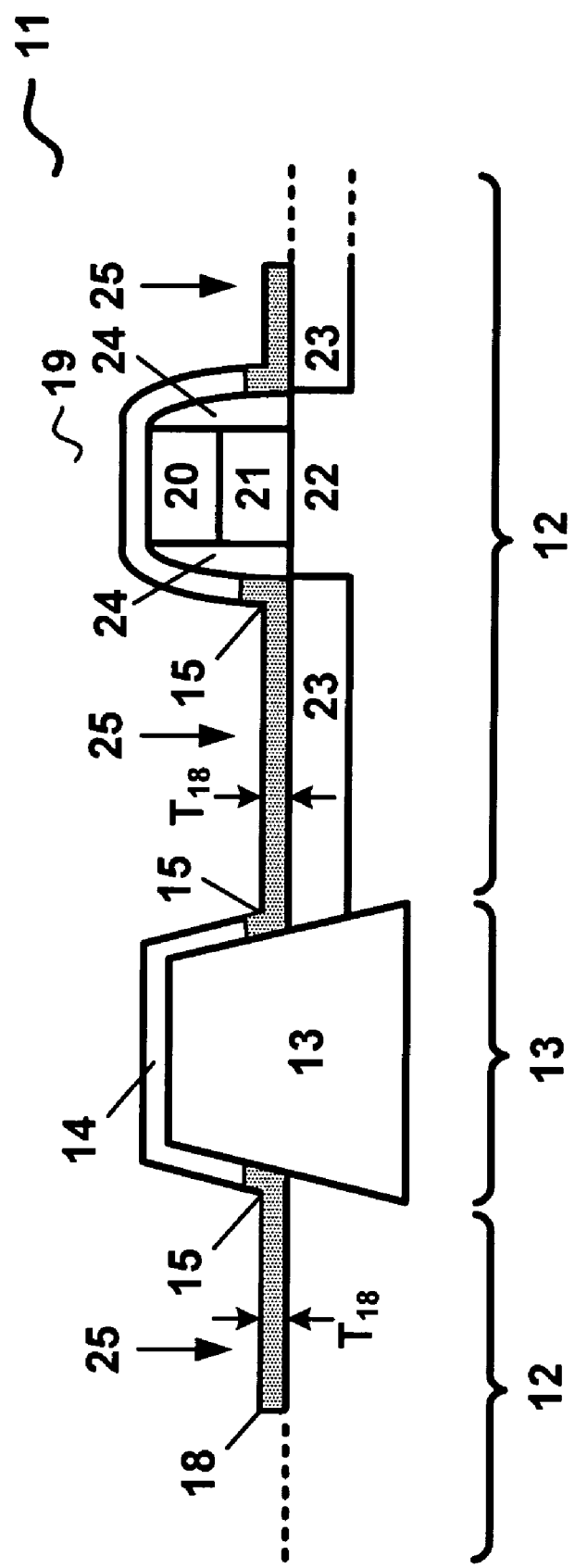

FIG. 13c shows a cross-section of the germanium substrate 11 of FIG. 13b after first thermal processing. Nickel 14 in contact with the germanium of the active areas 12 has reacted to form a first germanide layer 18 having a thickness $T_{18}$ in the center 25 of the exposed germanium areas. Near 15 the dielectric regions 13, 24, the nickel layer 14 is virtually thicker than in the central exposed regions 25 of the active area 12. At these steps, the topography will cause nickel to be present above the average level of the deposited nickel layer 14. Hence, germanium can diffuse to a level which is above the level of the germanide formed in the central exposed regions 25.

If sufficient thermal budget is provided during this first thermal step, germanium can diffuse over the isolation regions 13, 24 even if the germanide-forming process in the central regions 25 is halted by the absence of unreacted nickel 14. As disclosed in the embodiment illustrated by FIG. 12, the thermal budget of this first thermal process step is selected to have substantially all nickel react in the central regions 25. To accommodate for process variations, the first thermal budget can be somewhat higher, allowing negligible amounts of the germanium to diffuse on the dielectric regions 13, 24.

Near the edges 15 of the exposed germanium surface, the nickel germanide 18 formed can be somewhat thicker than $T_{18}$ in the center parts 25. This difference in germanide thickness between the border and center is preferably less than about 10%. The first thermal process step is executed during a period of nearly 0 seconds, in the case of spike anneal, to 300 seconds, typically from 10 to 60 seconds. The temperature of this first thermal step can be in the range of 150° C. to about 325° C., but would typically be between about 200° C. and about 275° C. Preferably, the first thermal budget has a temperature in the range from about 200° C. and about 275° C. and a time span of about from 10 to 60 seconds. Typically, an RTA step in a nitrogen atmosphere is performed to form the first germanide layer 18. Typically, this first germanide layer will be a metal-rich germanide layer comprising germanide phase such as $Ni_5Ge_3$ or $Ni_2Ge$.

Figure 13D:
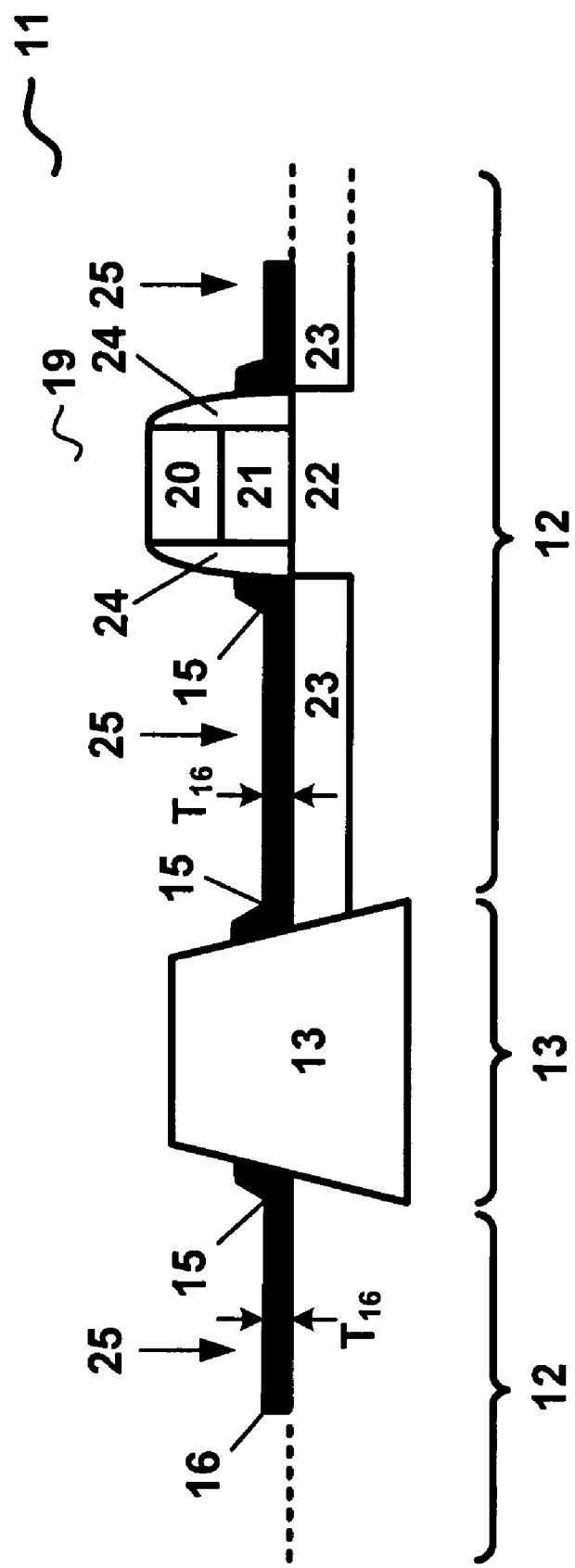

FIG. 13d shows a cross-section of the germanium substrate 11 of FIG. 13c after selective wet etch and second thermal processing, resulting in the desired germanide layer 16 having a thickness $T_{16}$ in the center 25 of the exposed germanium areas. After removing the unreacted nickel, the germanium at the edges 15 can no longer diffuse over the dielectric regions 13, 24. The thermal budget of the second thermal step is selected to convert the high resistive first germanide layer 18 into a lower resistive second germanide layer 16.

Typically, this step takes place in an RTA in a nitrogen atmosphere. The second thermal process step will be executed during a period of nearly 0 seconds, in the case of a spike anneal, to 300 seconds, typically from 10 to 60 seconds. The temperature of this second thermal step can be in the range of 300° C. to 550° C. A lower temperature range of 325° C. to 400° C. is typically sufficient to substantially complete the formation of the desired $Ni_1Ge_1$ phase, but higher temperatures may be used if required for other reasons. Preferably, the second thermal budget has a temperature in the range from about 325° C. and about 400° C. and a time span of about from 10 to 60 seconds.

In a preferred embodiment of the invention about 10 nm ($T_{14}$) of nickel 14 was sputtered on a patterned wafer 11 having active area topography. A first thermal step was performed using RTA in a nitrogen atmosphere at about 270° C. for about 30 seconds. The unreacted nickel 14 was removed selectively towards the germanide 18, the substrate 11 and the isolation region 13. Then a second thermal step was performed using RTA in a nitrogen atmosphere at about 360° C. for about 30 seconds.

Figure 14:
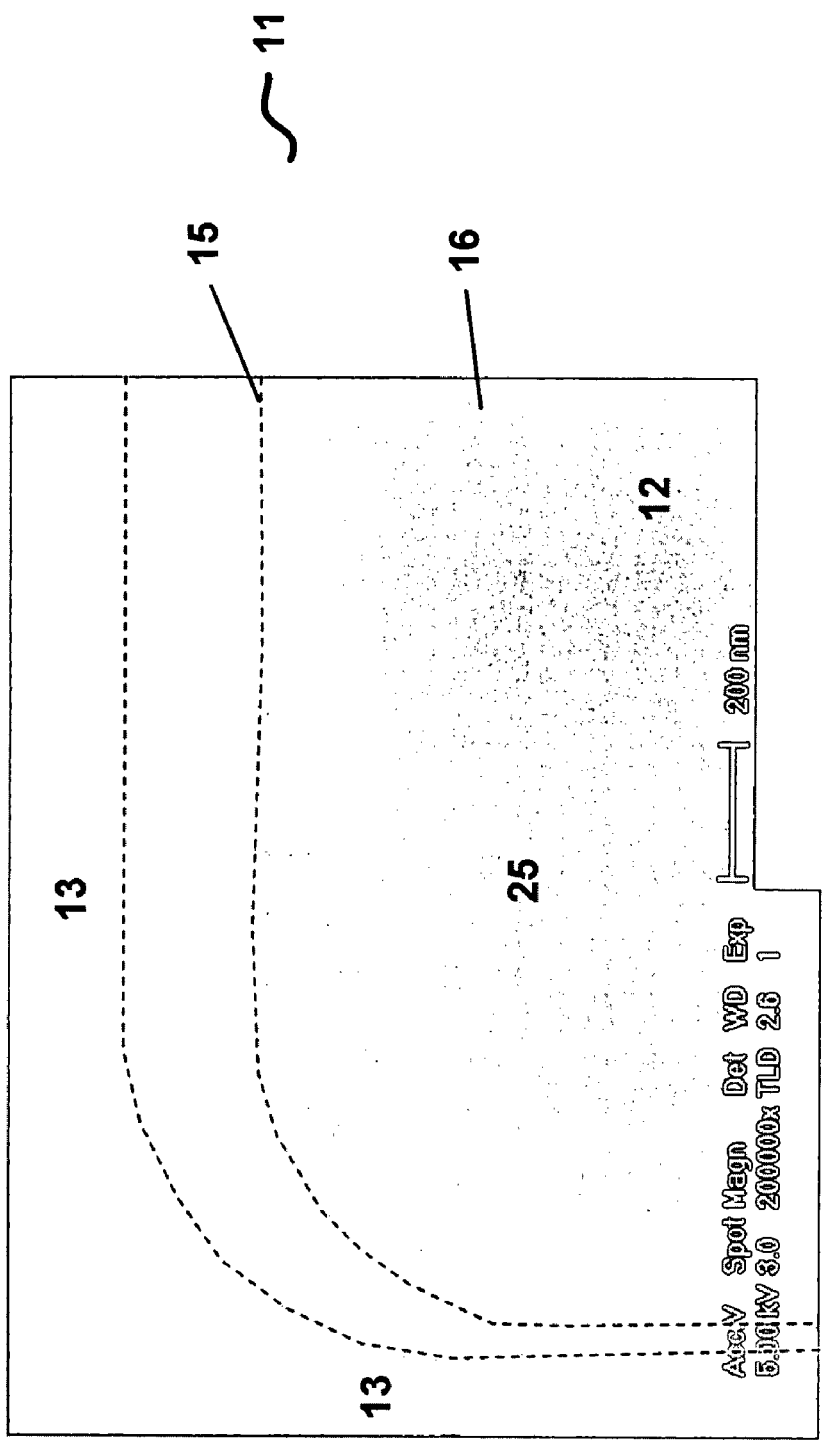
FIG. 14 shows a SEM picture of a nickel-germanide formed, according to an embodiment.

FIG. 14 shows a Scanning Electron Microscope (SEM) picture of a nickel-germanide layer formed on a patterned substrate 11 according to the embodiment illustrated in FIG. 13. Black dotted lines have been added to mark the contours of the dielectric region 13. No defects are seen in the active area region 12, the central region 25, or near the edge 15 with the dielectric region 13. Also, no germanide 16 is present on the dielectric region 13.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method for forming a nickel-germanide on a substrate, comprising:
    providing a substrate comprising an exposed germanium area bordering a dielectric area;
    depositing nickel over the substrate;
    performing a first thermal process step for which a first thermal budget is selected to convert, in center regions of the germanium area, substantially all metal into a nickel-germanide;
    selectively removing unreacted metal; and
    performing a second thermal process step for which a second thermal budget is selected to lower a resistance of the formed germanide layer;

wherein the nickel-germanide formed during the first thermal process step comprises metal-rich germanide phases and the nickel-germanide formed during the second thermal process step consists essentially of a mono-nickel mono-germanium (NiIGel) phase.

2. The method of claim 1, wherein the dielectric area is a field isolation region or a spacer.

3. The method of claim 1, wherein the germanide layer formed during the first thermal process step is predominantly a metal-rich germanide.

4. The method of claim 1, wherein the germanide-forming metal comprises nickel.

5. The method of claim 4, wherein the germanide-forming metal is nickel.

6. The method of claim 1, wherein a temperature of the first thermal step is in a range of 150° C. to 325° C., for a time period in a range of nearly 0 seconds to 300 seconds.

7. The method of claim 1, wherein a temperature of the first thermal step is in a range of 200° C. to 270° C., for a time period in a range of 10 seconds to 60 seconds.

8. The method of claim 1, wherein a temperature of the second thermal step is in a range of 300° C. to 550° C., for a time period in a range of nearly 0 seconds to 300 seconds.

9. The method of claim 1, wherein a temperature of the second thermal step is in a range of 325° C. to 400° C., for a time period in a range of 10 seconds to 60 seconds.

10. A method for forming a germanide on a substrate, comprising:
    providing a substrate comprising an exposed germanium area bordered by a dielectric area;
    depositing nickel over the substrate;
    performing a first thermal process step for which a first thermal budget is selected to convert, in regions of the germanium area away from the dielectric area, substantially all nickel into a nickel-germanide and to limit diffusion of germanium over the dielectric area;
    selectively removing unreacted nickel; and
    performing a second thermal process step for which a second thermal budget is selected to lower a resistance of the formned nickel-germanide layer;
    wherein the nickel-germanide formed during the first thermal process step comprises metal-rich germanide phases and the nickel-germanide formed during the second thermal process step consists essentially of a mono-nickel mono-germanium (NilGel) phase.

11. A method for forming a nickel-germanide on a substrate, comprising:
    providing a substrate comprising an exposed germanium area bordering a dielectric area;
    depositing nickel over the substrate;
    performing a first thermal process step for which a first thermal budget is selected to convert, in center regions of the germanium area, substantially all metal into a nickel-germanide;
    selectively removing unreacted metal; and
    performing a second thermal process step for which a second thermal budget is selected to lower a resistance of the formed germanide layer;
    wherein the nickel-germanide formed during the first thermal process step comprises metal-rich germanide phases and the nickel-germanide formed during the second thermal process step consists essentially of a mono-nickel mono-germanium ($Ni_fGe_l$) phase.

12. The method of claim 11, wherein the dielectric area is a field isolation region or a spacer.

13. The method of claim 11, wherein the germanide layer formed during the first thermal process step is predominantly a metal-rich germanide.

14. The method of claim 11, wherein the germanide-forming metal comprises nickel.

15. The method of claim 14, wherein the germanide-forming metal is nickel.

16. The method of claim 11, wherein a temperature of the first thermal step is in a range of 150° C. to 325° C., for a time period in a range of nearly 0 seconds to 300 seconds.

17. The method of claim 11, wherein a temperature of the first thermal step is in a range of 200° C. to 270° C., for a time period in a range of 10 seconds to 60 seconds.

18. The method of claim 11, wherein a temperature of the second thermal step is in a range of 300° C. to 550° C., for a time period in a range of nearly 0 seconds to 300 seconds.

19. The method of claim 11, wherein a temperature of the second thermal step is in a range of 325° C. to 400° C., for a time period in a range of 10 seconds to 60 seconds.

* * * * *